US008160268B2

(12) United States Patent
Horbach

(10) Patent No.: US 8,160,268 B2
(45) Date of Patent: *Apr. 17, 2012

(54) LOUDSPEAKER ARRAY SYSTEM

(75) Inventor: Ulrich Horbach, Agoura Hills, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1185 days.

This patent is subject to a terminal disclaimer.

(21) Appl. No.: 10/935,929

(22) Filed: Sep. 8, 2004

(65) Prior Publication Data

US 2005/0169493 A1 Aug. 4, 2005

Related U.S. Application Data

(63) Continuation-in-part of application No. 10/771,190, filed on Feb. 2, 2004.

(51) Int. Cl.

*H04R 1/02* (2006.01)

*H03G 5/00* (2006.01)

(52) U.S. Cl. .......................................... 381/89; 381/99

(58) Field of Classification Search .................... 381/89, 381/97–99, 182, 335

See application file for complete search history.

(56) References Cited

U.S. PATENT DOCUMENTS

| | | | | |
|---|---|---|---|---|
| 4,885,782 | A * | 12/1989 | Eberbach | 381/89 |
| 5,233,664 | A * | 8/1993 | Yanagawa et al. | 381/97 |
| 5,613,940 | A * | 3/1997 | Romano | 367/95 |
| 5,642,429 | A * | 6/1997 | Janssen | 381/97 |
| 6,128,395 | A | 10/2000 | De Vries | |
| 7,319,641 | B2 * | 1/2008 | Goudie et al. | 367/138 |
| 2003/0059056 | A1 | 3/2003 | Griniasty | |
| 2005/0041530 | A1 | 2/2005 | Goudie et al. | |

FOREIGN PATENT DOCUMENTS

| | | | |
|---|---|---|---|
| FR | 2828326 | A1 | 2/2003 |
| JP | 06-038289 | | 2/1994 |
| JP | 9512159 | T | 12/1997 |
| JP | 2001-095082 | | 4/2001 |
| WO | WO 96/14723 | | 5/1996 |
| WO | WO 03/034780 | A2 | 4/2003 |
| WO | WO 2004/075601 | A1 | 9/2004 |

OTHER PUBLICATIONS

John Eargle and William Gelow; Performance of Horn Systems: Low-Frequency Cut-off, Pattern Control, and Distortion Trade-Offs; Nov. 8-11, 1996; 19 pages.

JBL Professional; Progressive Transition™ (PT) Waveguides; Technical Notes vol. 1, No. 31; pp. 1-12; Apr. 2002.

Alastair Sibbald; Sensaura Transaural Acoustic Crosstalk Cancellation; pp. 1-10; 2001.

(Continued)

*Primary Examiner* — Ping Lee

(74) *Attorney, Agent, or Firm* — The Eclipse Group LLP

(57) ABSTRACT

The invention is a multi-channel loudspeaker system that provides a compact loudspeaker configuration and filter design methodology that operates in the digital signal processing domain. Further, the loudspeaker system can be designed as a multi-way loudspeaker system comprised of a symmetric arrangement of loudspeaker drivers in a two-dimensional plane and can achieve high-quality sound, constant directivity over a large area in both the vertical and horizontal planes and can be used in connection with stereo loudspeaker systems, multi-channel home entertainment systems and public address systems.

12 Claims, 22 Drawing Sheets

OTHER PUBLICATIONS

Charles E. Hughes; A Generalized Horn Design to Optimize Directivity Control & Wavefront Curvature; Sep. 24-27, 1999; 17 pages.

1 Limited; Digital Sound Projector; True Surround Sound from a Single Loudspeaker Panel; 4 pages; (undated).

Joseph A. D'Appolito; A Geometric Approach to Eliminating Lobing Error in Multiway Loudspeakers; Oct. 8-12, 1983; pp. 1-16.

Mithat F. Konar; Vertically Symmetric Two-Way Loudspeaker Arrays Reconsidered; May 11-14, 1996; pp. 1-20.

Ulrich Horbach; Design of High-Quality Studio Loudspeakers Using Digital Correction Techniques; Sep. 22-25, 2000; 22 pages (unnumbered).

Larry Greenhill; Snell Acoustics XA Reference Tower Loudspeaker; Stereophile Magazine, Apr. 2002; 7 pages (unnumbered).

Menno Van Der Wal, Evert W. Start and Diemer De Vries; Design of Logarithmically Spaced Constant-Directivity Transducer Arrays; Jun. 1996; J. Audio Eng. Soc., vol. 44, No. 6.

David Smith; Tech Facts: What is XA?; 7 pages (unnumbered).

Dynaudio; Confidence model C4; one page (unnumbered).

* cited by examiner

LOUDSPEAKER ARRAY SYSTEM

CROSS-REFERENCE TO RELATED APPLICATIONS

This application is a continuation-in-part of U.S. patent application Ser. No. 10/771,190 filed on Feb. 2, 2004 titled Loudspeaker Array System, and which is incorporated into this application in its entirety.

BACKGROUND OF THE INVENTION

1. Field of the Invention

This invention generally relates to a multi-way loudspeaker system and in particular to a multi-way loudspeaker system comprised of a symmetric arrangement of loudspeaker drivers in a two-dimensional plane capable of achieving high-quality sound for use in connection with stereo loudspeaker systems, multi-channel home entertainment systems and public address systems.

2. Related Art

Loudspeaker designers are constantly striving to design controlled directivity loudspeaker systems that achieve high quality sound across a wide range of frequency bands while limiting the size and number of transducers (i.e. drivers) in the system, as well as the required number of amplifiers (i.e. ways) in the system. Achieving such a high quality sound across a wide frequency range has been challenging due to the variation in size of the transducers across the dedicated parts of the audio frequency band and the constraints in spacing between the transducers.

High-quality loudspeakers for the audio frequency ranges generally employ multiple, specialized drivers for dedicated parts of the audio frequency band, such as tweeters (generally 2 kHz-20 kHz), midrange drivers (generally 200 Hz-5 kHz), and woofers (generally 20 Hz-1 kHz). Typically the higher frequency drivers are smaller in size than the lower frequency drivers.

To achieve a high sound quality, it is desirable to position the drivers in the loudspeaker as closely as possible to one another. However, because of the physical sizes of the specialized drivers, the ability to position the drivers in close proximity to one another is limited. The farther the drivers are positioned from one another, the more acoustic problems arise.

Because of the spacing between drivers due to their physical size, which is comparable with the wavelength of the radiated sound, the acoustic outputs of the drivers sum up to the intended flat, frequency-independent response only on a single line perpendicular to the loudspeaker, usually at the so-called acoustic center. Outside of that axis, frequency responses are more or less distorted due to interferences caused by different path lengths of sound waves traveling from the drivers to the considered points in space. Thus, there have been many attempts in history to build loudspeakers with a controlled sound field over a larger space with smooth out-of-axis responses.

The current state of art for controlling sound field in large spaces, such as public spaces, is to utilize uniform coverage horns for sound reinforcement. However, the use of uniform coverage horns has its disadvantages, as the uniform coverage horns have a limited frequency range, fixed, non-steerable polar patterns, and relatively high distortion.

Current two-dimensional arrays for surround sound in home entertainment, so-called sound projectors, are linearly spaced arrays of identical, small wide band drivers. This type of array is capable of producing multiple sound beams, which radiate into the room, and, while bouncing back from walls to the listener, produce the desired surround effect. However, since the drivers in the two-dimensional, linearly spaced arrays are identical, the maximum sound pressure level, and sound quality of the sound projector is limited to the capabilities of the transducers, which is in general rather poor, compared with drive units that are optimized for a dedicated frequency band. Further, the sound projector employs a very high number of drivers that all need to be driven individually, which leads to high implementation complexity and high cost.

Thus, a need still exists for a high-quality, low-distortion, two-dimensional loudspeaker configuration that employs a minimum number of transducers, as well as amplifiers, where the transducers are optimized for high performance by utilizing specialized drivers, such as tweeters, midrange drivers or woofers, across the audio frequency band. A further need still exists for a two-dimensional loudspeaker configuration to electronically alter beam widths and steering angles on site, as opposed to fixed installations using horn arrays.

SUMMARY

The invention is a multi-way array loudspeaker that can produce high-quality sound in high fidelity stereo systems, multi-channel home entertainment systems or public address systems.

In one embodiment, the array includes a plurality of tweeters, mid-range drivers and woofers that are arranged in a single housing or assembled as a single unit, having sealed compartments that separate certain drivers from one another to prevent coupling of the drivers. The array may be single channel having various signal paths from the input to individual loudspeaker drivers or to a plurality of drivers. Each signal path comprises digital input and contains a digital FIR filter, a D/A converter and a power amplifier, or a so-called power D/A converter, connected to either a single driver or to multiple drivers.

The performance, positioning and arrangement of the loudspeaker drivers in the array may be determined by a filter design algorithm that establishes the coefficients for each FIR filter in each signal flow path of the loudspeaker. A cost minimization function is applied to prescribed frequency points, using initial driver positions and initial directivity target functions, which are defined at frequency points on a logarithmic scale within the frequency range of interest. If the obtained results from the application of the cost minimization function do not meet the performance requirements of the system, the position of the drivers may then be modified and the cost minimization function may be reapplied until the obtained results meet the system requirements. Once the obtained results meet the system requirements, the filter coefficients for each linear phase FIR filter in a signal path are computed using the Fourier approximation method or other frequency sampling method.

The multi-way loudspeakers of the invention may include built-in DSP processing, D/A converters and amplifiers and may be connected to a digital network (e.g. IEEE 1394 standard). Further, the multi-way loudspeaker system of the invention, due to its compact dimensions, may be designed as a wall-mountable surround system.

The multi-way loudspeaker system may employ drivers of different sizes, producing low distortion, high-power handling because specialized drivers can operate optimal in their dedicated frequency band, as opposed to arrays of identical wide-band drivers. The multi-way speaker design of the invention can also provide better control of in-room responses due to smooth out-of-axis responses. The system is further able to control the frequency response of reflected sound, as well as the total sound power, and to suppress floor and ceiling reflections.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
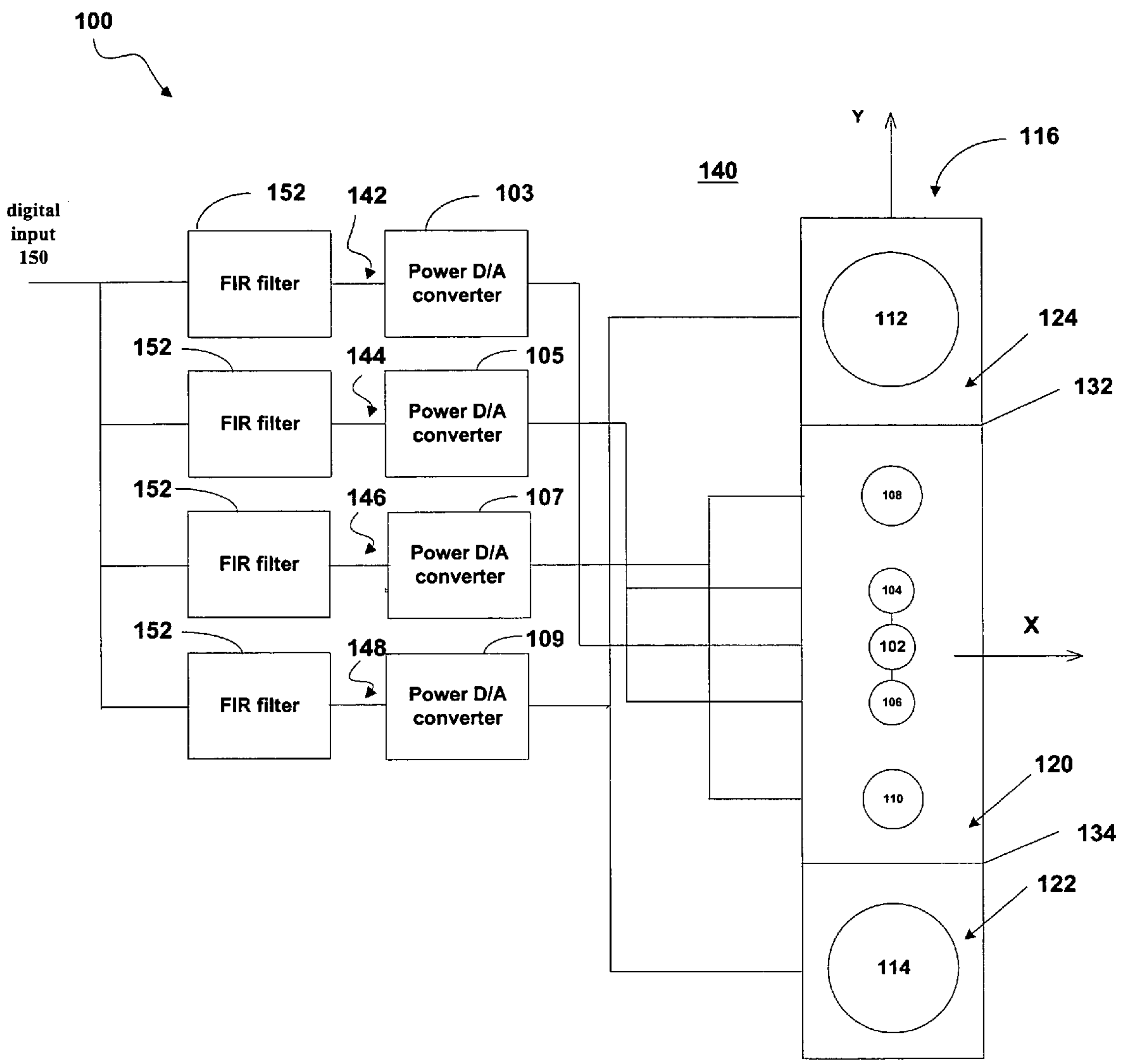
FIG. 1 illustrates an example of a one-dimensional four-way loudspeaker system mounted along the y-axis symmetrically to origin and a block diagram of signal flow to each of the loudspeaker drivers in the system.

FIG. 1 illustrates an example implementation of a one-dimensional (1D) multi-way loudspeaker 100 which forms the bases of the invention and a block diagram of the signal flow to each of the loudspeaker drivers in the system 100. As shown in FIG. 1, the multi-way loudspeaker 100 may be designed as a four-way loudspeaker having (i) a center tweeter 102 connected to a first power D/A converter 103, (ii) two additional tweeters 104 and 106 connected to a second power D/A converter 105, (iii) two midrange drivers 108 and 110 connected to a third power D/A converter 107, and (v) two woofers 112 and 114 connected to a fourth power D/A converter 109. The connection between the loudspeakers to each amplifier represents a different way in the multi-way loudspeaker.

In FIG. 1, the drivers, also referred to as transducers, may be mounted in a housing 116 comprised of separate sealed compartments 120, 122, and 124, as indicated by separators 132 and 134. By mounting the drivers in separate sealed compartments, coupling of the neighboring drivers is minimized. Although the various compartments are visible in FIG. 1, the loudspeaker system may be designed such that the compartments are not visible to the consumer when embodied in a finished product. Compartment 124, containing woofer 112 may be separated by separator 132 from compartment 120, which contains midrange drivers 108 and 110 and tweeters 102, 104 and 106. Similarly, compartment 122, containing woofer 114 may be separated by separator 134, from compartment 120, which contains midrange drivers 108 and 110 and tweeters 102, 104 and 106. All of the tweeters 102, 104, 106 may be contained in the same compartment 120 as the midrange drivers 108 and 110 without the necessity of separating the tweeters 102, 104 and 106 from the midrange drivers because the tweeters 102, 104 and 106 are typically sealed.

FIG. 1 illustrates the center tweeter 102, tweeters 104 and 106, midrange drivers 108, 110 and low-frequency woofers 112 and 114 mounted linearly along the y-axis and symmetrically about the center tweeter 102. A typical arrangement may include tweeters 102, 104 and 106 of outer diameters of approximately 40-50 mm, midrange drivers 108 and 110 of outer diameters of approximately 80-110 mm, and woofers 112 and 114 of outer diameters of approximately 120-250 mm. Typically, transducer cone size may differ based on the desired application and desired size of the array. Further, the transducers may utilize neodymium magnets, although it is not necessary for the described application to utilize that particular type of magnet.

When utilizing tweeters of diameter 50 mm, midrange drivers of 110 mm and woofers of 160 mm, an example implementation of the system may include the center tweeter 102 mounted on the y-axis at the center point 0 at the intersection between the x and y axis. The tweeters 104 and 106 may be mounted at their centers approximately +/−60 mm from the center point. The midrange drivers 110 and 108 may then be mounted at their centers approximately +/−150 mm from the center point 0. The low-frequency woofers 112 and 114 may then be mounted at their centers approximately +/−300 mm from the center point.

FIG. 1 also illustrates a block diagram 140 of the signal flow of the multi-way loudspeaker system. While FIG. 1 illustrates four ways 142, 144, 146 and 148 of signal flow, a channel may be divided into two or more ways. The signal flow comprises a digital input 150 that may be implemented using standard interface formats, such as SPDIF or IEEE1394 and their derivatives, and that can be connected to the drivers through various paths or ways, such as those illustrated in FIG. 1. Each path or way 142, 144, 146 and 148 may contain a digital FIR filter 152 and a power D/A converter 103, 105, 107 and 109 connected to either a single or to multiple loudspeaker drivers. The power D/A converters 103, 105, 107 and 109 may be realized as cascades of conventional audio D/A converters (not shown) and power amplifiers (not shown), or as class-D power amplifiers (not shown) with direct digital inputs. The FIR filters 152 may be implemented with a digital signal processor (DSP) (not shown). The loudspeaker drivers may be tweeters, midrange drivers or woofers, such as those illustrated.

In operation, the outputs of each multiple FIR filter 152 are connected to multiple power D/A converters 103, 105, 107 and 109 that are then fed to multiple loudspeaker drivers 102, 104, 106, 108, 110, 112, and 114 that are mounted on a baffle of the housing 116. More than one driver, such as 104 and 106, may be connected in parallel to a path or way 142, 144, 146 and 148 containing a power D/A converter 103, 105, 107 and 109.

Figure 2:
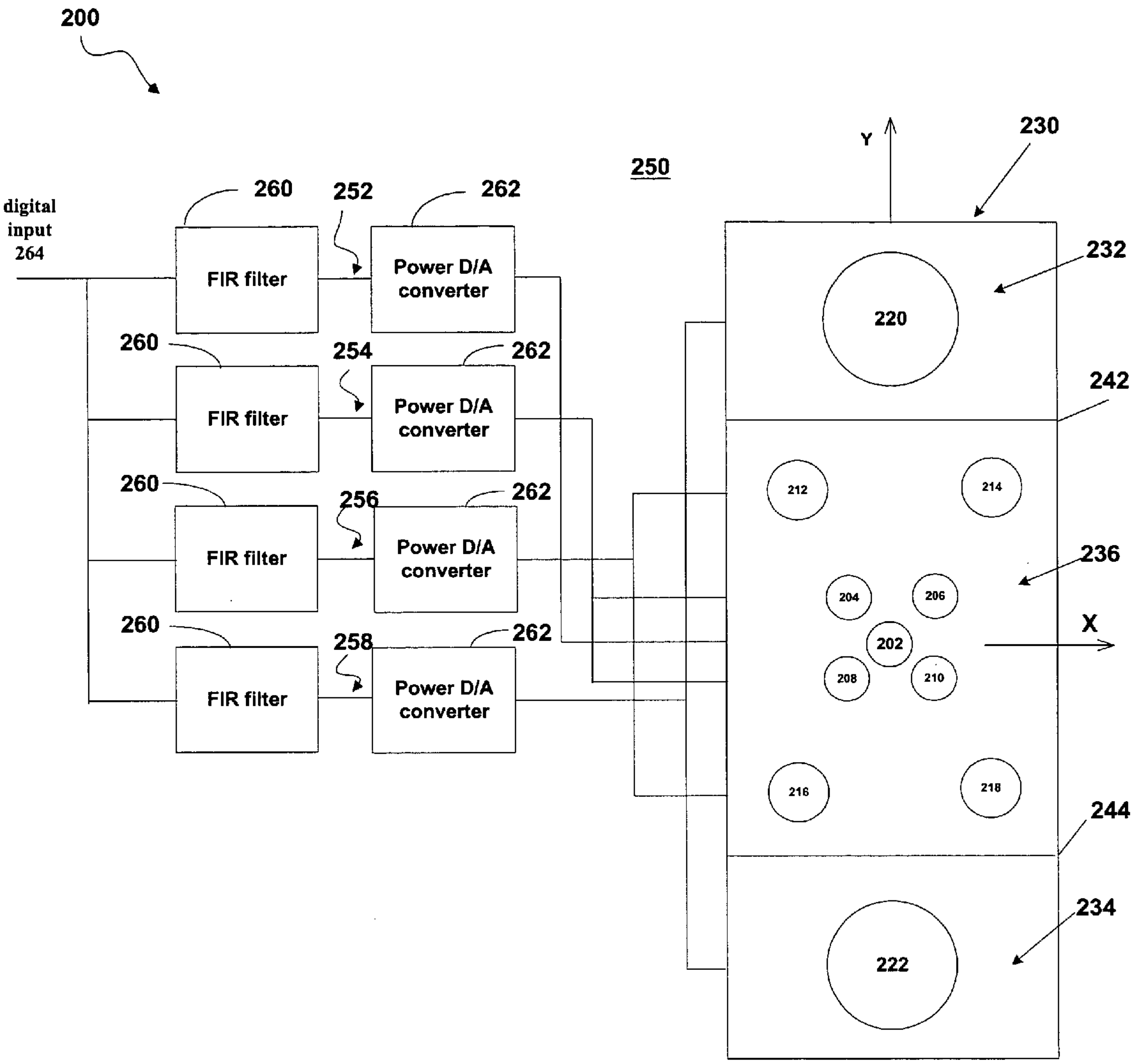
FIG. 2 illustrates an example of a two-dimensional four-way loudspeaker system mounted along the x-axis and y-axis symmetrically to origin and a block diagram of signal flow to each of the loudspeaker drivers in the system.

FIG. 2 illustrates a two-dimensional multi-way loudspeaker 200 that is derived by splitting the tweeters 104 and 106 and midrange drivers 108 and 110 of FIG. 1 into pairs. As further discussed below, the paired drivers may be electrically connected with each other and may be fed by the same filters as the one-dimensional (1D) multi-way loudspeaker 100 of FIG. 1. Therefore, directivity along y-axis is not affected and stays the same as originally specified in far field. New directivity properties, may, however, be introduced along the x-axis, as desired.

In particular, FIG. 2 illustrates a single channel, two-dimensional, four-way loudspeaker 200 having a center tweeter 202 encircled by four additional tweeters 204, 206, 208 and 210. Additionally, the loudspeaker 200 contains four midrange drivers 212, 214, 216 and 218 and two woofers 220 and 222.

Tweeters 204, 206, 208 and 210, the midrange drivers 212, 214, 216 and 218 and the two woofers 220 and 222 are all aligned linearly along the y-axis symmetrically about the center tweeter 202. The pair of tweeters 204 and 206 and the pair of tweeters 208 and 210 are each located on one side of the center tweeter 202, above and below the center line defined by the x-axis. Similarly, one pair of midrange drivers 212 and 214 are positioned above the tweeters 202, 204, 206, 208 and 210 and the other pair of midrange drivers 216 and 218 are positioned below the tweeters 202, 204, 206, 208 and 210, symmetrically with respect to the center line defined by the x-axis.

Similar to the loudspeaker system 100 in FIG. 1, the loudspeaker system in FIG. 2 may include tweeters 202, 204, 206, 208 and 210 of outer diameters of approximately 40-50 mm, midrange drivers 212, 214, 216 and 218 of outer diameters of approximately 80-110 mm, and woofers 220 and 222 of outer diameters of approximately 120-250 mm. As stated previously, transducer cone size may differ based on the desired application and desired size of the array.

In general, the design of an n-way system results in optimum positional coordinates $y_0$, +/−($y_1$, $y_2$, $y_3$, . . . $y_{n-1}$), and filter coefficients for the filters FIR(0, 1, 2, 3, . . . n−1), for a specified directivity target function. In the given example n equals 4, when generating a two-dimensional array, the drivers with indices (1, . . . , m), m<=n may be split into pairs (here m=1 and m=2). Thus, the corresponding x-coordinates are +/−($x_1$, $x_2$, . . . , $x_m$), while the y-coordinates remain unchanged from the one-dimensional design.

The y-coordinates in the two-dimensional loudspeaker system 200 may be designed smaller than the physical dimensions of the drivers, as illustrated in FIG. 2, since space is gained by splitting and moving the drivers in x-direction. Thus, an additional degree of freedom is gained from the two-dimension design, which generally results in further improved performance.

Directivity along the x-axis can be tailored by optimizing the positioning parameters $x_1$, . . . , $x_m$, and the value of m itself. Drivers with indices (m+1) . . . n−1 are not split and remain at their original position. This means that the x-axis array is a truncated version of the original prototype array which was designed for the y-axis. Therefore, the directivity functions will exhibit a higher corner frequency.

The coefficients $x_1$ . . . $x_m$ may be optimized such that smooth, frequency-independent directivity functions result along the x-axis. In case of $x_1<y_1$, $x_2<y_2$, . . . the array will be less directive in x-direction. In case of $x_1=y_1$, $x_2=y_2$, . . . , both will be equal at high frequencies.

In the example provided in FIG. 2, the center tweeter 202 may be mounted on the y-axis at the center point 0, which is illustrated in FIG. 2 at the intersection between the x and y axis. The tweeters 204, 206, 208 and 210 are mounted at their centers at approximately +/−30 mm along the x-axis and approximately +/−42 mm along the y-axis (+/−30 mm, +/−42 mm).

The midrange drivers 212, 214, 216 and 218 may then be mounted at their centers approximately +/−80 mm from the center point 0 along the x-axis and approximately +/−120 mm along the y-axis (+/−80 mm, +/−120 mm). The woofers 220 and 222 are then mounted at their centers approximately +/−300 mm from the center point (+/−0 mm, +/−300 mm).

Similar to the loudspeaker system 100 in FIG. 1, the transducers may be mounted in a housing 230 comprised of separate sealed compartments 232, 234 and 236, as indicated by separators 242 and 244. Compartment 232, containing woofer 220, may be separated by separator 242 from compartment 236, which contains midrange drivers 212, 214, 216 and 218 and tweeters 202, 204, 206, 208 and 210. Similarly, compartment 234, containing woofer 222 may be separated by separator 244, from compartment 236, which contains midrange drivers 216, 214, 216 and 218 and tweeters 202, 204, 206, 208 and 210.

FIG. 2 also illustrates a block diagram 250 of the signal flow of the multi-way loudspeaker system 200. FIG. 2 illustrates four ways 252, 254, 256 and 258 of signal flow. The signal flow comprises a digital input 264 that may be implemented using standard interface formats connected to the drivers through various paths or ways, such as the four ways illustrated in FIG. 2. Each path or way 252, 254, 256 and 258 may contain a digital FIR filter 260 and a power D/A converter 262 connected to either a single or to multiple loudspeaker drivers.

Figure 3:
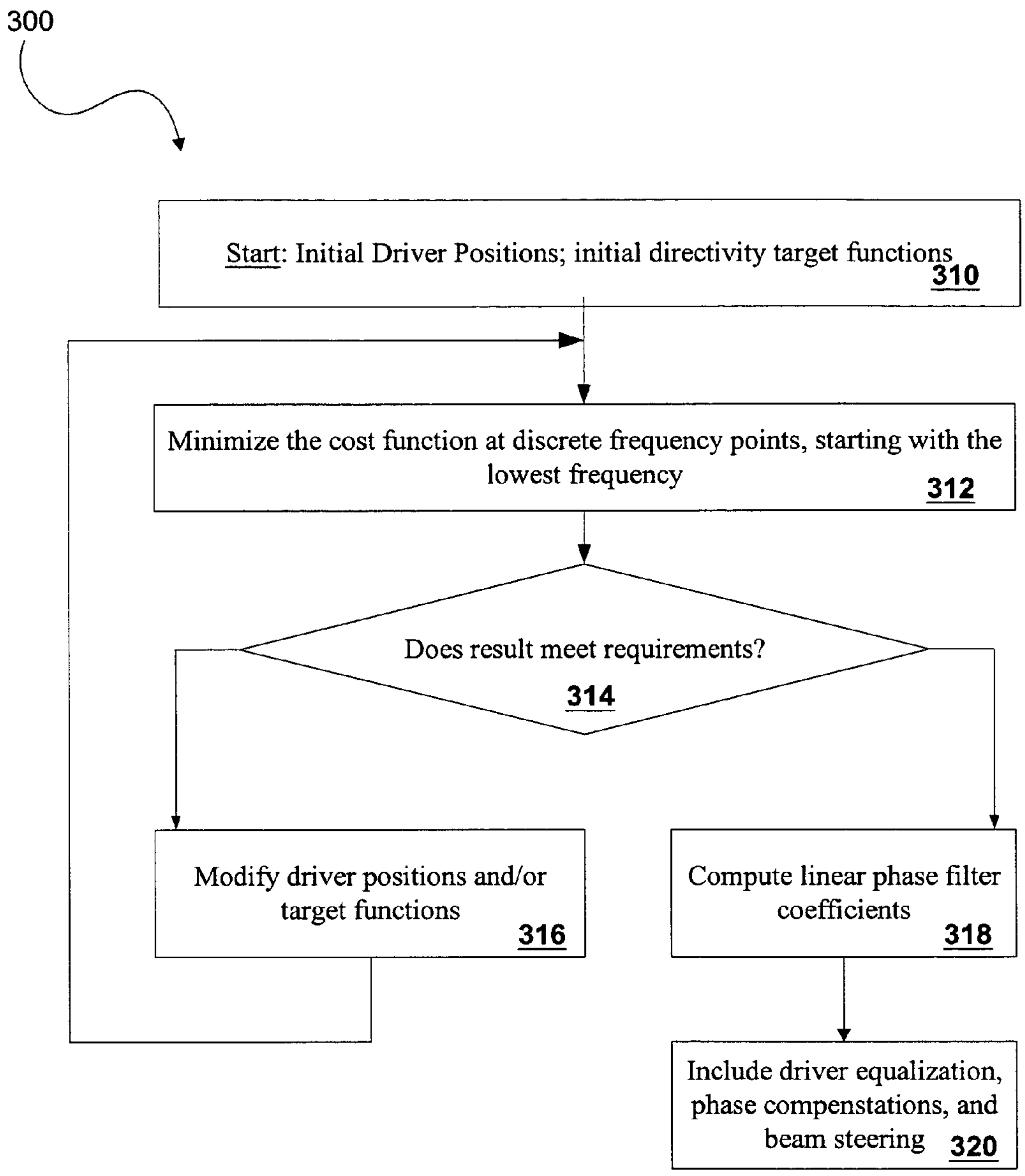
FIG. 3 is a flow chart of a filter design algorithm used to design the loudspeaker system.

FIG. 3 is a flow chart of a filter design algorithm 300 used to design the loudspeaker system of the invention. The purpose of the filter design algorithm 300 is to determine the coefficients for each FIR filter for each signal flow path of the loudspeaker. As illustrated in further detail below, the initial driver positions and initial directivity target functions are first determined 310. The initial positions or design configuration of the speaker and drivers may be designed in accordance with a number of different variables, depending upon the application, such as the desired size of the speaker, intended application or use, manufacturing constraints, aesthetics or other product design aspects. Driver coordinates are then prescribed for each driver along the main axis. Initial guesses for directivity target functions are then set, which includes establishing frequency points on a logarithmic scale within an interval of interest. The cost function is then minimized at the prescribed frequency points 312. If the results do not meet the performance requirements of the system, step 314, the position of the drivers are then modified and the cost minimization function is applied again 316. This cycle may be repeated until the results meet the requirements. Once the results meet the requirements, the linear phase filter coefficients are computed 318. Additionally computations 320 may also be made to equalize the drivers and to compensate for phase shifts and to allow beam steering.

In the first step 310, the initial driver positions and initial directivity target functions are established. As previously mentioned, the number, position, size and orientation of the drivers are primarily determined by product design aspects. Once orientated, initial coordinate values may then be prescribed for initial driver coordinates p(n), n=1 . . . N for N drivers on the main axis. For example, in a one-dimensional (1D) array as illustrated in FIG. 1, N=7: p(n)=[−0.30, −0.15, −0.06, 0, 0.06, 0.15, 0.30] m (meters). In a two-dimensional (2D) array as illustrated in FIG. 2, N=7 p(n)=[−0.30, −0.12, −0.042, 0, 0.042, 0.12, 0.30]m.

If the geometry of the two-dimensional layout, as depicted in FIG. 2, is symmetrical along both the x and y axis, the design process for the two-dimensional layouts can be carried out in one dimension, i.e., along the main, as described above. Due to the symmetry, the same directivity characteristics will result along the opposing, except of a higher corner frequency.

Figure 4:
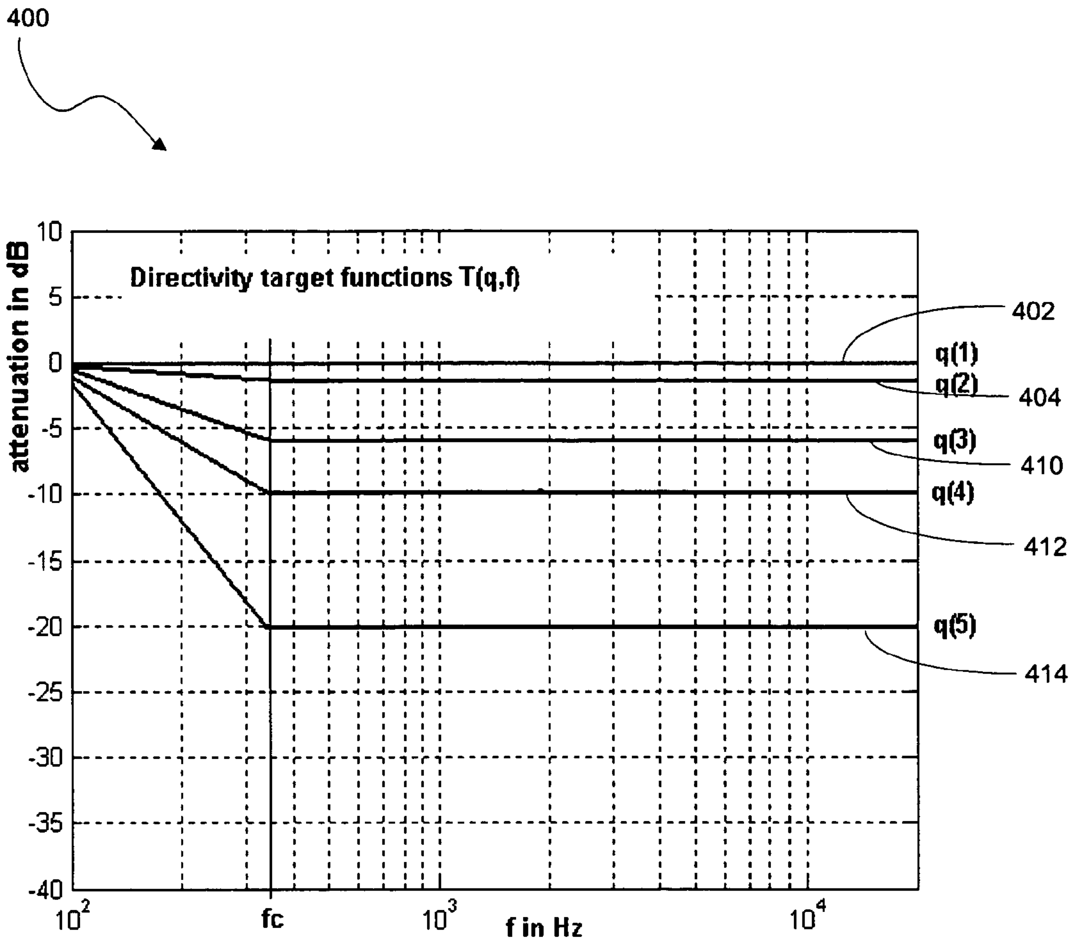
FIG. 4 is a graph illustrating the directivity target functions for angle-dependent attenuation.

To determine the initial directivity target functions, one must define initial guesses for directivity target functions T(f,q), which are determined based upon the desired performance of the drivers at specific angles q. FIG. 4 is a graph illustrating an example set of target functions for angle-dependent attenuation at five specific angles q. The directivity target functions specify the intended sound level attenuation in dB (y-axis) that can be measured at various frequencies at sufficiently large distance from the speaker (larger than the dimensions of the speaker) in an anechoic environment, at an angle q degrees apart from a line perpendicular to the origin (center tweeter). Frequency vector f specifies a set of frequency points, e.g. 100, on a logarithmic scale within the interval of interest, e.g. 100 Hz . . . 20 kHz.

Angle vector q(i), i=1, . . . , Nq specifies a set of angles for which the optimization will be performed. While FIG. 4, illustrates the initial guess for directivity at five angles:

$$(Nq=5)\text{: } q=[0, 10, 20, 30, 40]^\circ,$$

in most cases it may be sufficient to prescribe directivity at only two angles, i.e., Nq=2. In this instance, targeted directivity may be specified at an outer angle, for example 40 degrees, and at 0 degrees, the prescribed zero directivity on axis, i.e., q=[0, 40]°.

Except for the on-axis target function, the target functions at each angle, are linearly descending on a double logarithmic scale from T=0 dB at f=0 until a value T<0 dB at a specified frequency fc (e.g. fc=350 Hz), then remain constant. The on-axis target function 402 remains constant at 0 db across the entire frequency range. The target directivity functions at ten (10) degrees 404, twenty (20) degrees 410, thirty (30) degrees 412 and forty (40) degrees 414, all begin at T=0 dB and descend on a double logarithmic scale until the functions reach fc, which is represented by 350 Hz in FIG. 4, and then remain constant across the remaining frequency range of interest.

Figure 5:
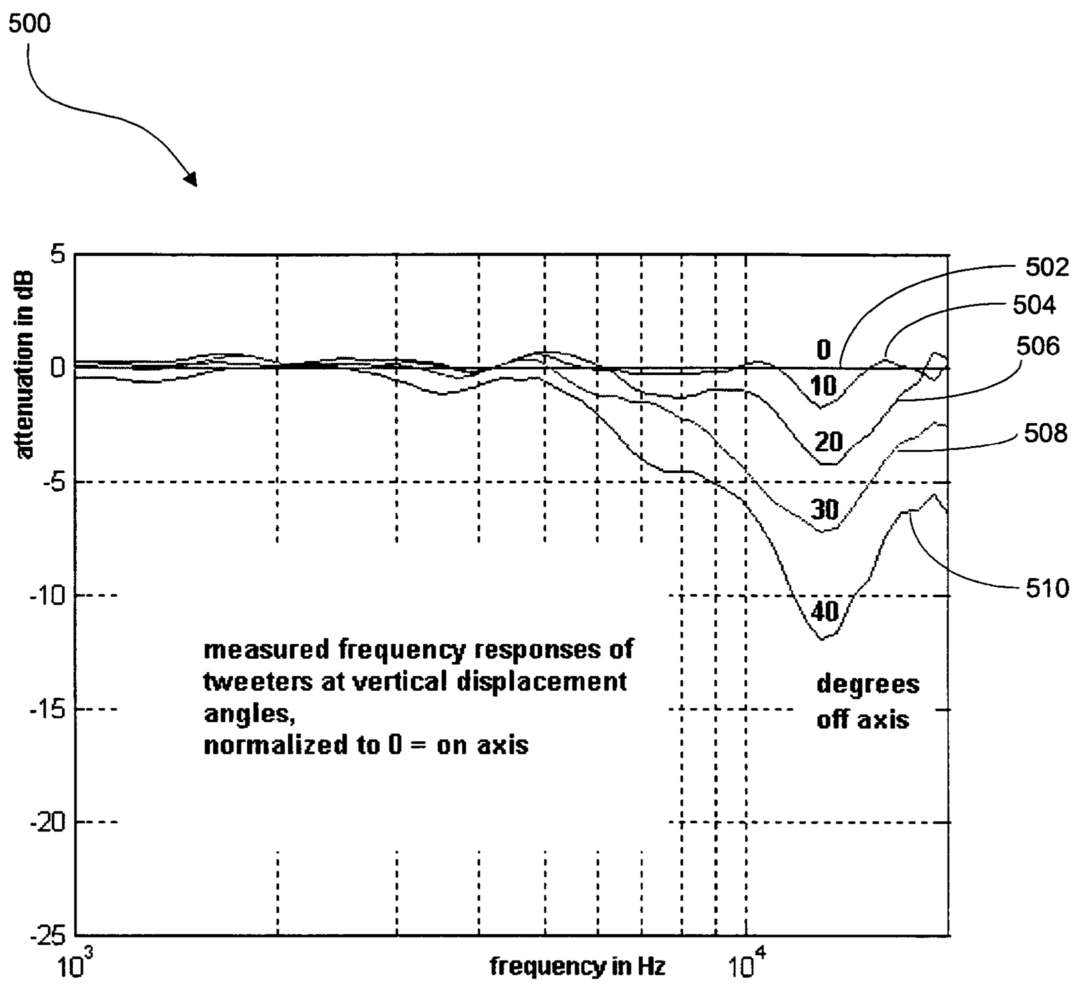
FIG. 5 is a graph illustrating measured amplitude frequency responses of one mounted tweeter at various vertical out-of-axis displacement angles.

After the initial driver positions and initial directivity target functions are determined, the next step 312 is to minimize the cost function F(f) at the prescribed frequency vector points f, starting with the lowest frequency increment stepwise, e.g. 100 Hz, using the obtained solution as the initial solution for the next step, respectively, by using the following equations:

$$F(f) = \sum_{q(i)} [|V(f, q)| - T(f, q)]^2, \text{ with}$$

$$V(f, q) = \sum_{n=1}^{N} H_m(n, f, q) \cdot C_{opt}(n, f) \cdot \exp\left\{-j \cdot \frac{2\pi}{l(f)} \cdot \sin(q/180 \cdot \pi) \cdot p(n)\right\},$$

$$l = \frac{c}{f}, \ c = 345 \text{ m/sec}, \ j = \sqrt{-1}$$

where $H_m$(n, f, q) is a set of measured amplitude frequency responses for the considered driver n, frequency f, and angle q, normalized to the response obtained on axis (angle zero), an example of which is illustrated in FIG. 5. FIG. 5 illustrates the measured frequency responses 500 of one mounted tweeter at various vertical displacement angles normalized to on axis. In FIG. 5, line 502 represents the on-axis response, line 504 is the measured frequency response at ten degrees, line 506 is the response at twenty degrees, line 508 is the response at thirty degrees and line 510 is the measured frequency response at forty degrees, all measured at frequencies ranging between 1 kHz and 20 kHz.

Further, the minimization is performed by varying real-valued frequency points of the channel filters $C_{opt}$(n,f), where n is the driver index and f is frequency, within the interval [0, 1]. In addition, the constraint $$C_{opt}(n,f)=0, f>f_o, f<f_u$$

must be fulfilled, depending on properties of particular driver n. For example, in case of a woofer, the upper operating limit is fo=1 kHz, for a tweeter, the lower limit is fu=2 kHz, for a midrange driver it could be fu=300 Hz, fo=3 kHz .

The above described procedure for minimizing the cost function may be performed by a function "fminsearch," that is part of the Matlab® software package, owned and distributed by The Math Works, Inc. The "fminsearch" function in the Matlab software packages uses the Nelder-Mead simplex algorithm or their derivatives. Alternatively, an exhaustive search over a predefined grid on the constrained parameter range may be applied. Other methodologies may also be used to minimize the cost function.

If the deviation between the obtained result and the target is sufficiently small, or acceptable as determined by one skilled in the art for the particular design application, the FIR filter coefficients for each signal path in the line array are then obtained.

If the deviation between the obtained results and the target are not acceptable for the particular design application, i.e. or are too large, the driver positions or geometry, and/or parameters q(i) and fc of the target function T(f,g) (see FIG. 4) should then be modified. Once modified, the cost minimization function should again be applied and the process should be repeated until obtained results and the target are sufficiently small or with an acceptable range for the application.

Once the driver positions and driver geometry are positioned such that the algorithm as shown in FIG. 3 yields results within an acceptable range of the target function, the FIR filter coefficients for each signal path n=1 . . . N must then be determined, depicted as step 318 in FIG. 3. One method for determining the FIR coefficients is to use a Fourier approximation (frequency sampling method), to obtain linear phase filters of given degree. When applying the Fourier approximation, or other frequency sampling method, a degree should be chosen such that the approximation becomes sufficiently accurate.

The Fourier approximation method may be performed by a function "firls," that is part of the Matlab® software package, owned and distributed by The Math Works, Inc. Similar methodologies may be used to minimize the cost function by implementing in other software systems.

Additionally, modifications can be made to the FIR filters to equalize the measured frequency response of one or more drivers (in particular tweeters, midranges). The impulse response of such a filter can be obtained by well-known methods, and must be convolved with the impulse response of the linear phase channel filter when determining the FIR filter coefficients, as described above. Further, the voice coils (acoustic centers of the drivers) may not be aligned. To compensate for this, appropriate delays can be incorporated into the filters by adding leading zeros to the FIR impulse response.

The two-dimensional, multi-way loudspeaker system may be arranged for use in connection with a variety of applications, such as stereo loudspeaker systems, multi-channel home entertainment systems and public address systems. One skilled in the art may vary the number, type and position of the drivers, the number of channels, the number of signal flow paths or ways, as well as modify the positioning parameters along one axis to tailor directivity for a specified application.

Figure 6:
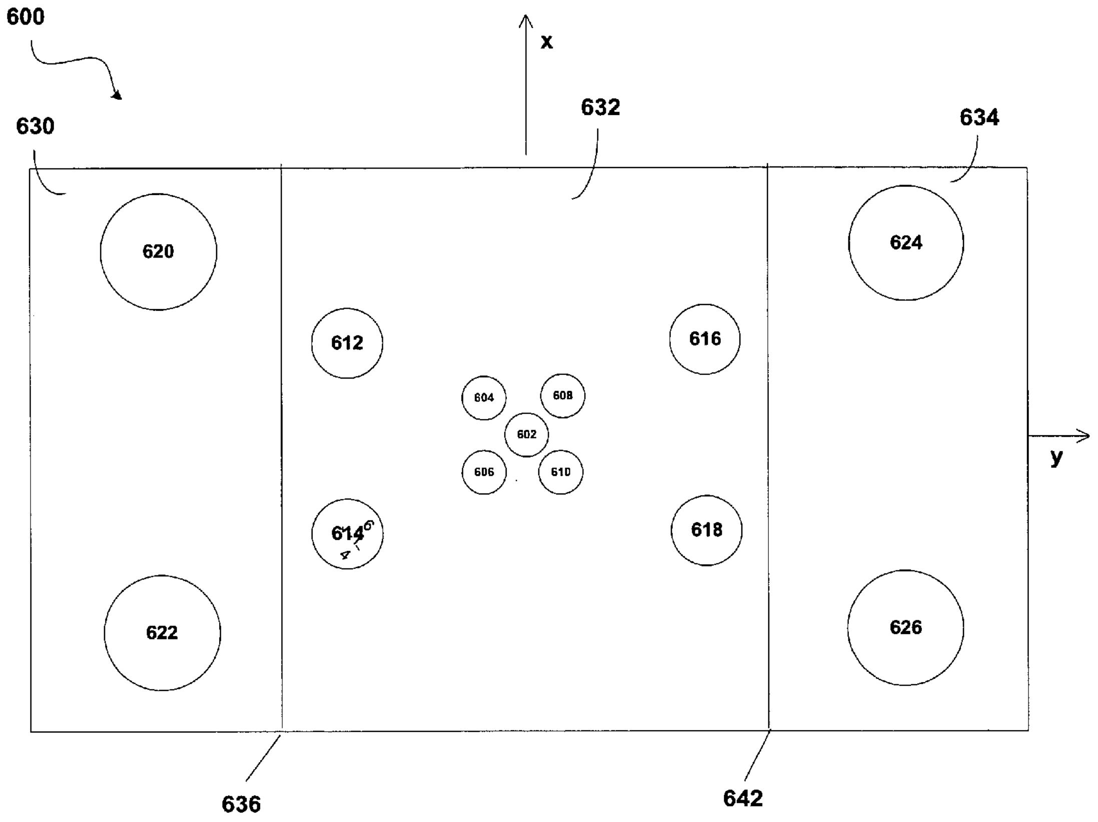
FIG. 6 illustrates another example of a two-dimensional four-way loudspeaker system mounted along the y and x-axis symmetrically to origin.

FIG. 6 is yet another two-dimensional multi-way loudspeaker, similar to the loudspeaker in FIG. 2, except that the loudspeaker system contains four woofers 620, 622, 624 and 626, rather than two woofers. The arrangement depicted in FIG. 6 is a design that one skilled in the art may find desirable for use in sound reeinforcement applications.

In the example provided in FIG. 6, the center tweeter 602 may be mounted on the x-axis at the center point 0, which is illustrated in FIG. 6 at the intersection between the x and y axis. The tweeters 604, 606, 608 and 610 are mounted at their centers at approximately +/−42 mm along the y-axis and approximately +/−30 mm along the x-axis (+/−30 mm, +/−42 mm).

The midrange drivers 612, 614, 616 and 618 may then be mounted at their centers approximately +/−110 mm from the center point 0 along the y-axis and approximately +/−80 mm along the x-axis (+/−80 mm, +/−110 mm). The woofers 620, 622, 624, and 626 are then mounted at their centers at approximately +/−300 mm along the y-axis and approximately +/−180 mm along the x-axis (+/−180 mm, +/ 300 mm).

Similar to the loudspeaker systems 100 and 200 in FIGS. 1 and 2, respectively, the transducers may be mounted in a housing 630 comprised of separate sealed compartments 630, 632 and 634, as indicated by separators 636 and 642.

Figure 7:
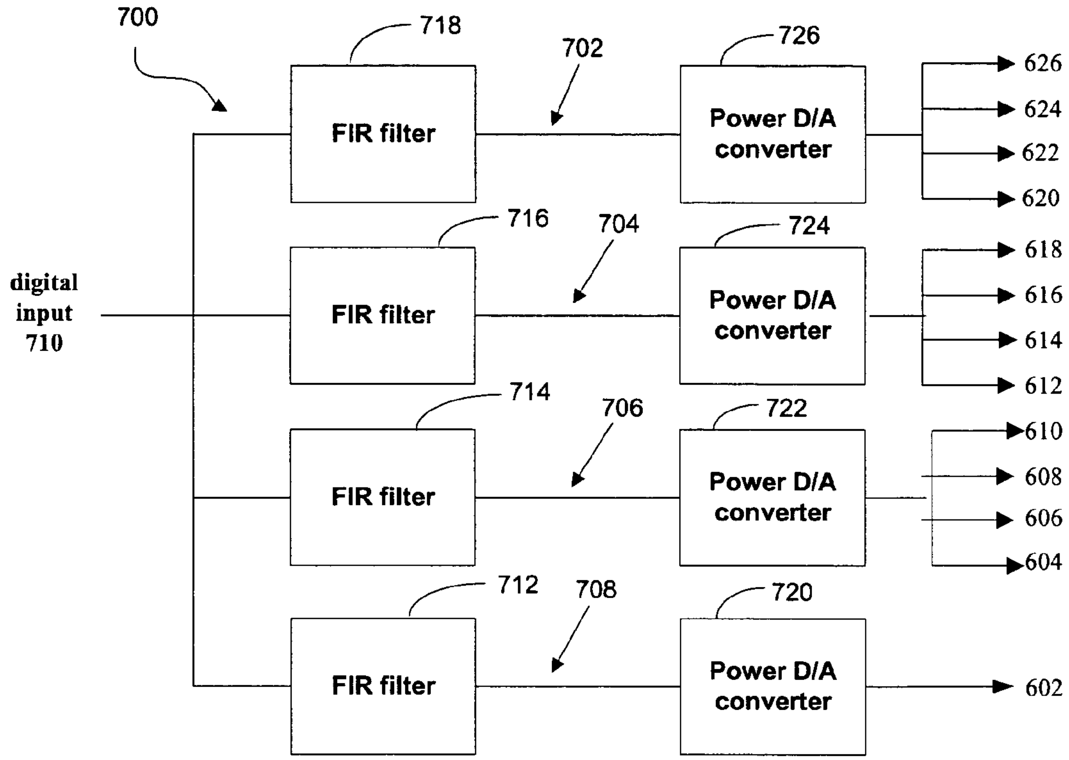
FIG. 7 is a block diagram of the signal flow to each of the loudspeaker drivers illustrated in FIG. 6.

FIG. 7 illustrates a block diagram 700 of the signal flow of the multi-way loudspeaker system 600 of FIG. 6. FIG. 7 illustrates four ways 702, 704, 706 and 708 of signal flow. The signal flow comprises a digital input 710 that may be implemented using standard interface formats connected to the drivers through various paths or ways, such as the four ways illustrated in FIG. 7. Each path or way 702, 704, 706 and 708 may contain a digital FIR filter 712, 714, 716, 718 and a power D/A converter 720, 722, 724, 726 connected to either a single or to multiple loudspeaker drivers.

As illustrated in FIG. 7, signal flow way 702 feeds woofers 620, 622, 624 and 626 of the loudspeaker system 600 of FIG. 6. Signal flow way 704 feeds midrange drivers 612, 614, 616 and 618 of the loudspeaker system 600 of FIG. 6. Signal flow way 706 feeds tweeters 604, 606, 608 and 610 of the loudspeaker system 600 in FIG. 6 and signal flow way 708 feeds the center tweeter 602 of the loudspeaker system 600 in FIG. 6.

Figure 8:
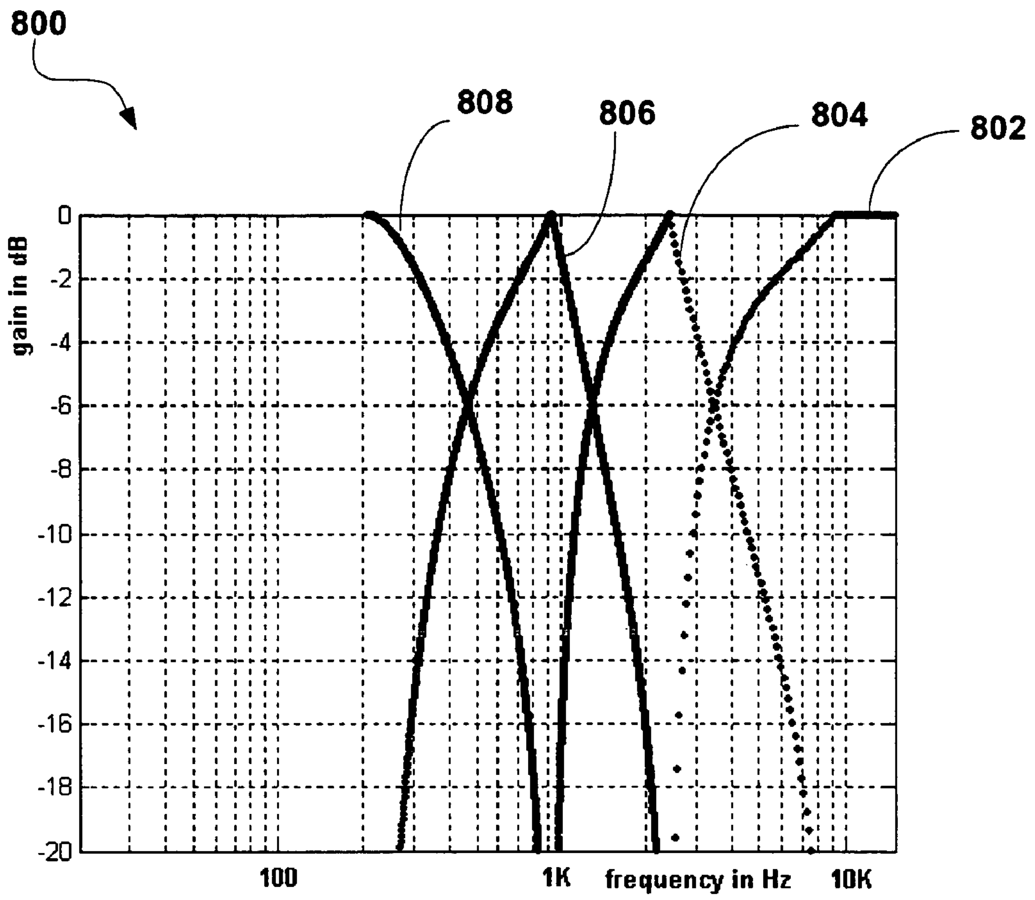
FIG. 8 depicts the frequency responses of the four filters of the loudspeaker system in FIG. 6.

FIG. 8 is a graph 800 of acceptable obtained results for the frequency responses of the four filters, illustrated in FIG. 7, as applied to a loudspeaker system similar to the one illustrated in FIG. 6. In particular, line 802 represents the results for the frequency response of FIR filter 712. Line 804 represents the results for the frequency response of the FIR filter 714; line 806 represents the results for the frequency response of the FIR filter 716 and line 718 represents the results for the frequency response of the FIR filter 718.

Figure 9:
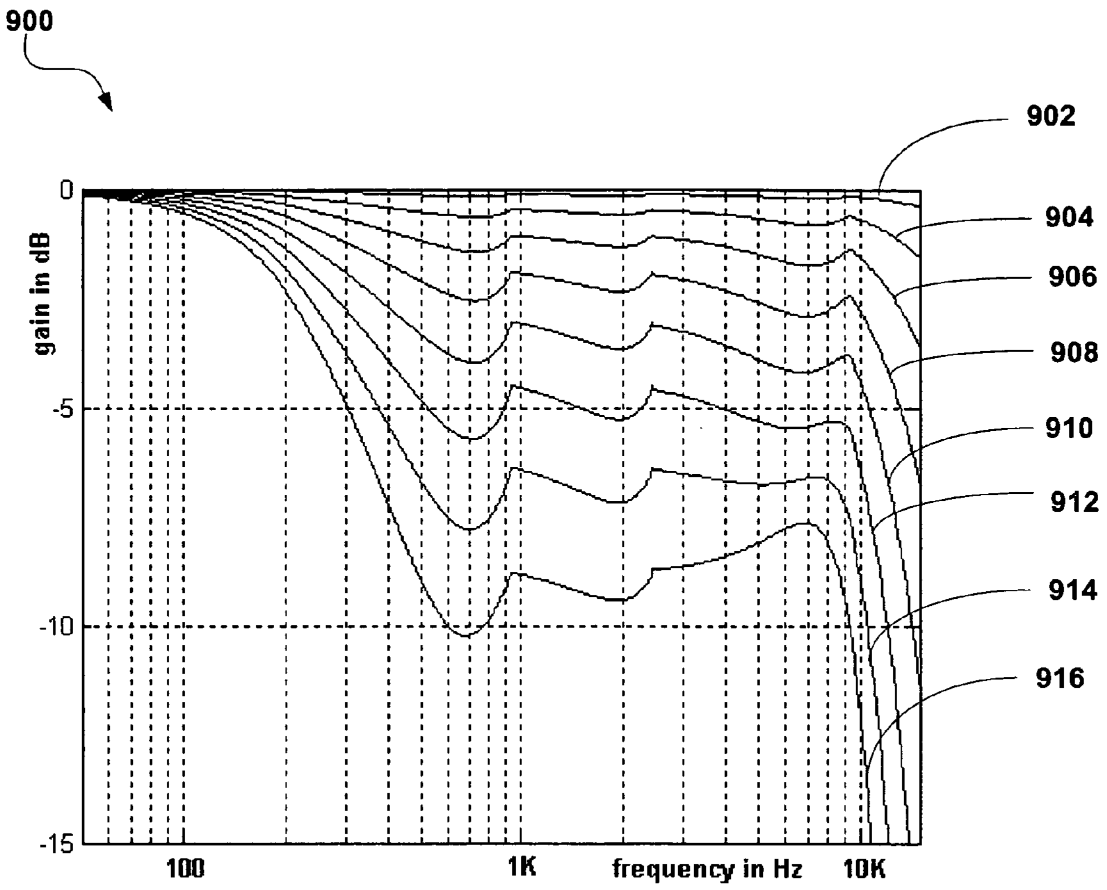
FIG. 9 illustrates the resulting horizontal (y-axis) frequency responses of the loudspeaker system in FIG. 6 measured at various angles.

FIG. 9 is a graph 900 illustrating the resulting horizontal (y-axis) frequency response at various angles. The graph shows the obtained filter frequency responses V(f,q) after passing step 314 in FIG. 3. Passing means that the result met the requirements. In particular, line 902 represents the resulting horizontal on-axis response V(f,q(1)), line 904 is the frequency response at five degrees V(f,q(2)), line 906 is the response at ten degrees V(f,q(3)), line 908 is the response at fifteen degrees V(f,q(4)), line 910 is the response at twenty degrees V(f,q(5)), line 912 is the response at twenty-five degrees V(f,q(6)), line 914 is the response at thirty degrees V(f,q(7)), and line 916 is the response at thirty-five degrees V(f,q(8)), all shown at frequencies ranging between 100 Hz and 20 kHz.

Figure 10:
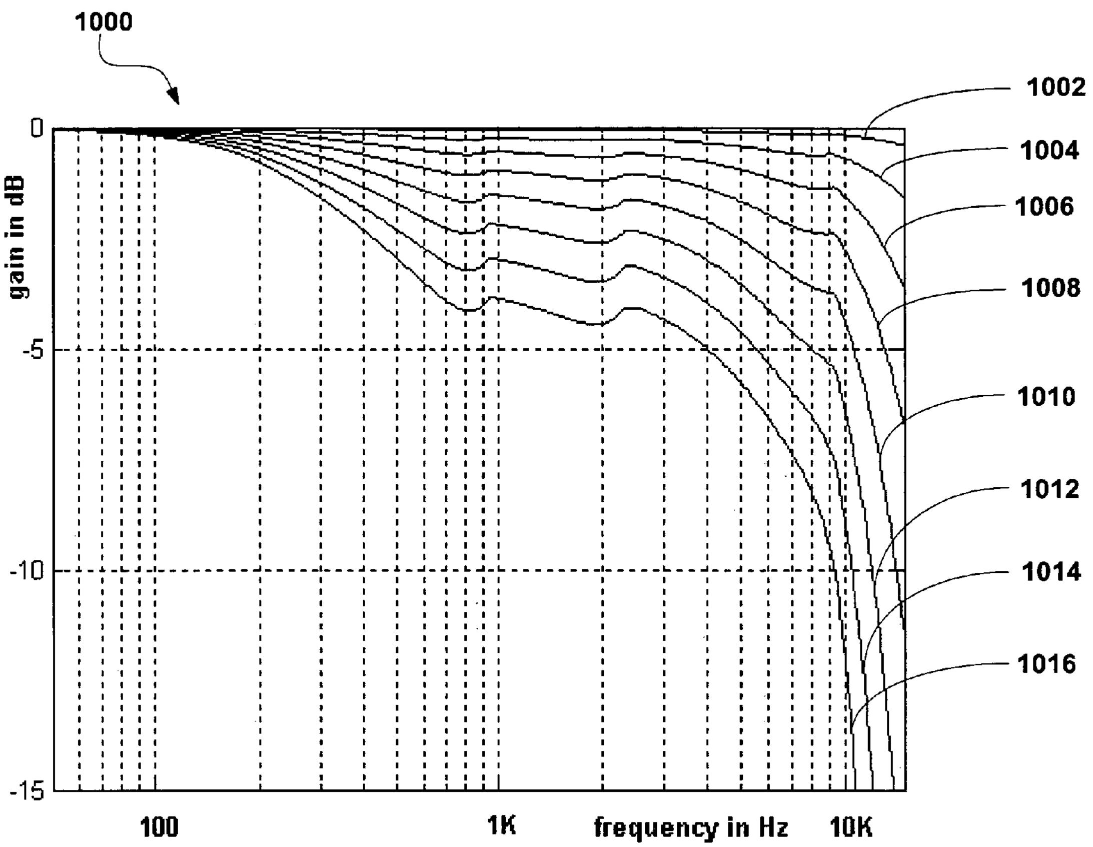
FIG. 10 illustrates the resulting vertical (x-axis) frequency responses of the loudspeaker system in FIG. 6 that corresponds to the horizontal responses shown in FIG. 9.

FIG. 10 is a graph 1000 illustrating the resulting vertical (x-axis) frequency response at various angles. In particular, line 1002 represents the resulting vertical on-axis response V(f,q(1)), line 1004 is the frequency response at five degrees V(f,q(2)), line 1006 is the response at ten degrees V(f,q(3)), line 1008 is the response at fifteen degrees V(f,q(4)), line 1010 is the response at twenty degrees V(f,q(5)), line 1012 is the response at twenty-five degrees V(f,q(6)), line 1014 is the response at thirty degrees V(f,q(7)), and line 1016 is the response at thirty-five degrees V(f,q(8)), all shown at frequencies ranging between 100 Hz and 20 kHz.

FIGS. 11-22 represent example implementation of multi-way loudspeakers for loudspeaker systems suitable for home entertainment applications.

Figure 11:
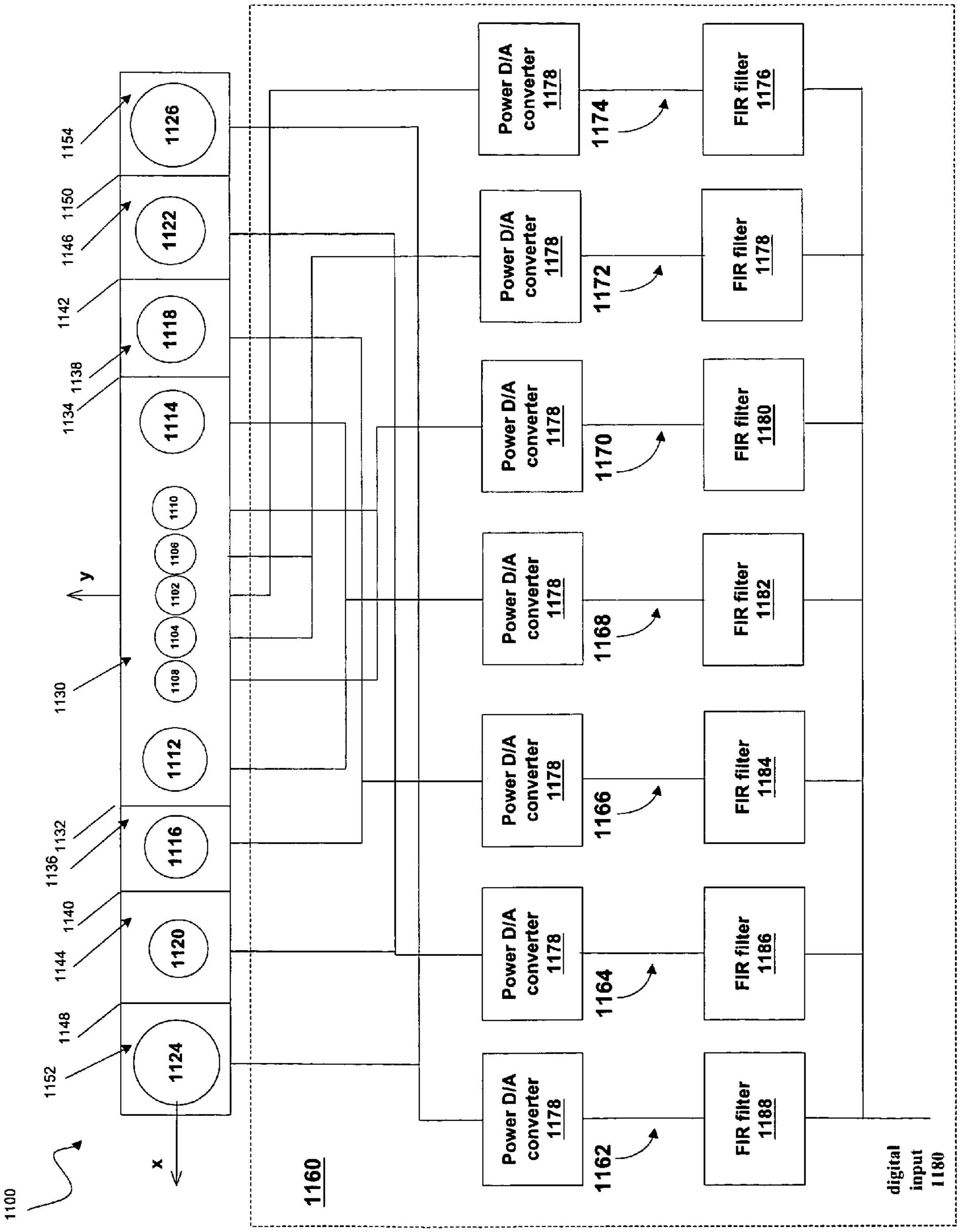
FIG. 11 illustrates an example implementation of a one-dimensional (1D) seven-way loudspeaker system mounted symmetrically along the y-axis and a block diagram of signal flow to each of the loudspeaker drivers in the system.

FIG. 11 illustrates an example implementation of a one-dimensional (1D), seven-way loudspeaker system 1100 mounted symmetrically along the x-axis and a block diagram 1160 of signal flow to each of the loudspeaker drivers in the system. This example implementation may serve as a basis for the two-dimensional (2D), multi-way loudspeaker system designs 1400 and 1700 illustrated in FIGS. 14 and 17, which may be designed for use in home entertainment applications, or other suitable applications known by those skilled in the art.

As illustrated in FIG. 11, the one-dimensional, seven-way loudspeaker system 1100 may include (i) one center tweeter 1102, positioned at the point of origin; (ii) a first pair of tweeters 1104 and 1106, one tweeter positioned on each side of the center tweeter 1102 at +/−0.035 m along the x-axis; (iii) a second pair of tweeters 1108 and 1110, one positioned on each side of the first pair of tweeters at +/−0.07 m along the x-axis; (iv) a first pair of midrange drivers 1112 and 1114 positioned at +/−0.12 m along the x-axis; (v) a second pair of midrange drivers 1116 and 1118 positioned at +/−0.20 m along the x-axis; (vi) a third pair of midrange drivers 1120 and 1122 positioned at +/−0.34 m along the x-axis; and (vii) a pair of woofers 1124 and 1126 positioned at +/−0.54 m along the x-axis.

As in previously illustrated embodiments, the drivers may be contained with a housing having various compartments. The tweeters 1102, 1104, 1106, 1108 and 1110 and mid-range drivers 1112 and 1114 may be positioned within one compartment 1130. Positioned adjacent to compartment 1130 separated by separator 1132 on one side of compartment 1136 which contains the mid-range driver 1116. On the opposing side of compartment 1130 separated by separator 1134 is compartment 1138 which contains the mid-range driver 1118. Compartment 1144 contains mid-range driver 1120 and is separated on one side from compartment 1136 by separator 1140 and on the other side from compartment 1152, which contains woofer 1124, by separator 1148. Similarly, compartment 1146 contains mid-range driver 1122 and is separated on one side from compartment 1138 by separator 1142 and on the other side from compartment 1154, which contains woofer 1126, by separator 1150.

The loudspeaker system 1100 may receive digital input 1180. The signal flow diagram 1160 illustrates the center tweeter 1102 being fed by signal flow way 1174, which includes FIR filter 1176 and a power D/A converter 1178. The first pair of tweeters 1104 and 1106 is fed by signal flow way 1172, which includes FIR filter 1178 and a power D/A converter 1178 and the second pair of tweeters 1108 and 1110 is fed by signal flow way 1170, which includes FIR filter 1180 and a power D/A converter 1178. The first pair of midrange drivers 1112 and 1114 is fed by signal flow way 1168, which includes FIR filter 1182 and a power D/A converter 1178, while the second pair of midrange drivers 1116 and 1118 is fed by signal flow way 1166, which includes FIR filter 1184 and power D/A converter 1178. The third pair of midrange drivers 1120 and 1122 is fed by signal flow way 1164, which includes FIR filter 1186 and power D/A converter 1178. Finally, the pair of woofers 1124 and 1126 is fed by signal flow way 1162, which includes FIR filter 1188 and a power D/A converter 1178.

Figure 12:
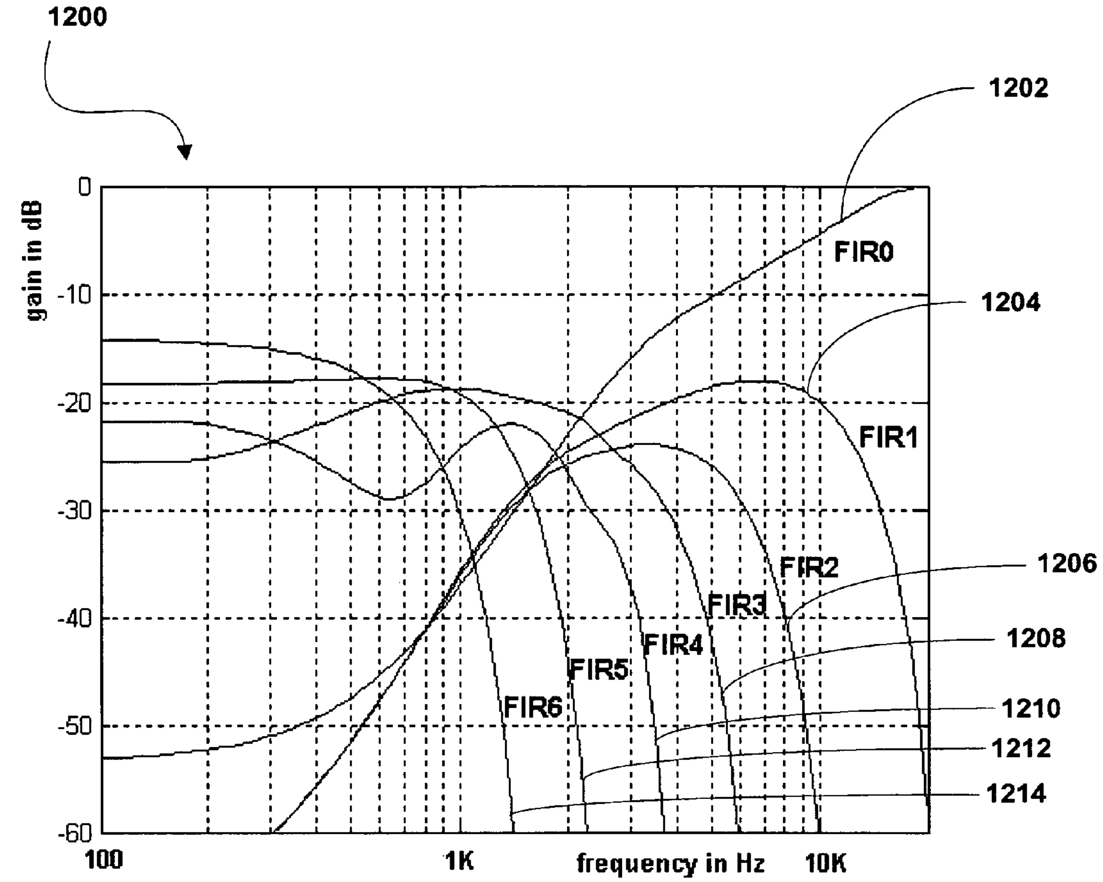
FIG. 12 shows the frequency responses of the seven filters of the loudspeaker system in FIG. 11.

FIG. 12 is a graph 1200 illustrating the frequency responses of the seven filters of the loudspeaker system in FIG. 11 once the cost minimization function has been applied and the obtained results have been found to be sufficiently small or within the acceptable range for the desired application. The line represented by 1202 is the frequency response of FIR filter 1176; line 1204 is the frequency response of FIR filter 1178; line 1206 is the frequency response of FIR filter 1180; line 1208 is the frequency response of FIR filter 1182; line 1210 is the frequency response of FIR filter 1184; line 1212 is the frequency response of FIR filter 1186; and line 1214 is the frequency response of FIR filter 1188.

Figure 13:
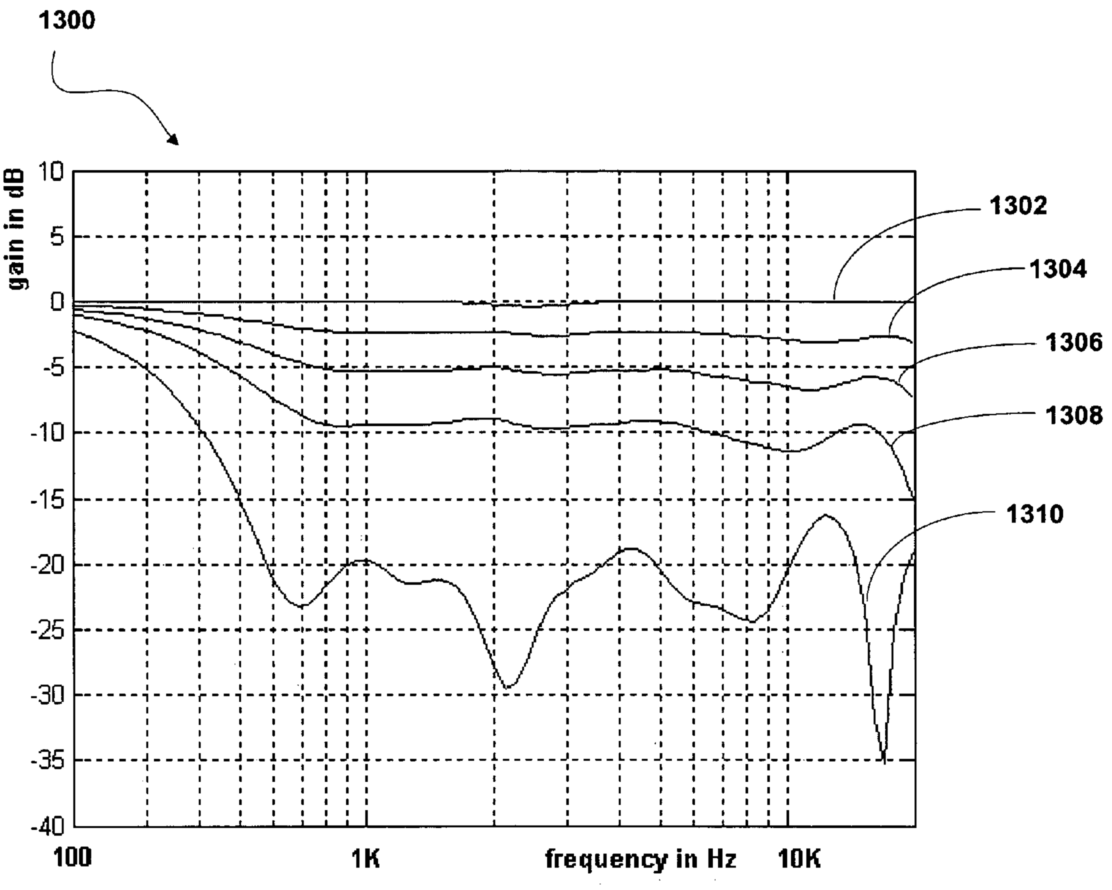
FIG. 13 illustrates the resulting horizontal (x-axis) frequency responses of the loudspeaker system in FIG. 11 measured at various angles.

FIG. 13 is a graph 1300 that illustrates the resulting horizontal (x-axis) frequency responses of the loudspeaker system in FIG. 11 measured at various angles. The graph shows the obtained filter frequency responses V(f,q) after the requirements in step 314 in FIG. 3 have been met. In particular, line 1302 represents the resulting horizontal on-axis response V(f,q(1)), line 1304 is the frequency response at ten degrees V(f,q(2)), line 1306 is the response at fifteen degrees V(f,q(3)), line 1308 is the response at twenty degrees V(f,q(4)), line 1310 is the response at thirty degrees V(f,q(5)), all shown at frequencies ranging between 100 Hz and 20 kHz.

Figure 14:
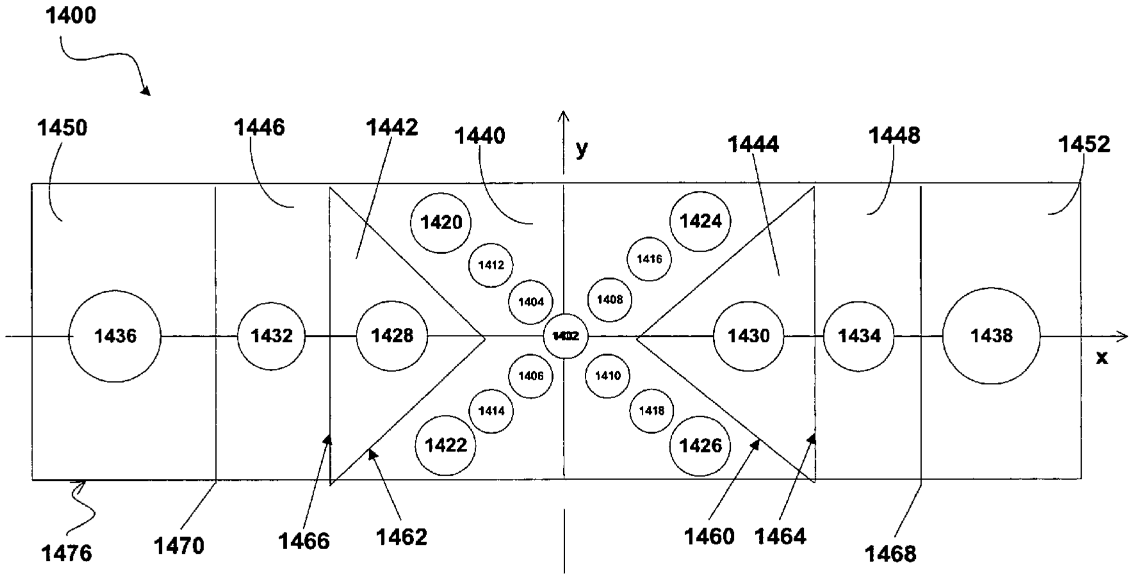
FIG. 14 illustrates an example implementation of a two-dimensional (2D), multi-channel, seven-way loudspeaker system mounted symmetrically along the x-axis and y-axis.

FIG. 14 illustrates an example implementation of a two-dimensional (2D), multi-channel, seven-way loudspeaker system 1400 mounted symmetrically along the x-axis and y-axis. The loudspeaker system 1400 is derived by splitting the tweeters 1104, 1106, 1108 and 1110, and the midrange drivers 1112 and 1114 of the loudspeaker system 1100 in FIG. 11 into pairs.

The loudspeaker system 1400 controls directivity in two dimensions and comprises a center tweeter 1402; four pairs of tweeters 1404 and 1406, 1408 and 1410, 1412 and 1414, and 1416 and 1418; four pairs of mid-range drivers 1420 and 1422, 1424 and 1426, 1428 and 1430 and 1432 and 1434; and a pair of woofers 1436 and 1438. The first two pairs of tweeters 1404 and 1406 and 1408 and 1410 are arranged in quadratic configurations respectively about the center tweeter 1402. A third and forth pair of tweeters 1412, 1414, 1416 and 1418 are positioned on a further distant quadrant, symmetrically along the x and y axis. The first and second pairs of mid-range drivers 1420, 1422, 1424 and 1428 are positioned on yet a further distant quadrant, symmetrically along the x and y axis. As will be explained further below, the inner quadrants are defined by a forty-five (45) degree angle relative to the x-axis.

Additionally, the midrange drivers 1428, 1430, 1432 and 1434 and the woofers 1436 and 1438 are linearly spaced across the x-axis. The (x, y) coordinates of the drivers of the loudspeaker 1400 may be as follows:

Tweeter 1402: (0, 0)

Tweeters 1404, 1406, 1408 and 1410: (+/−35, +/−35) mm

Tweeters 1412, 1414, 1416 and 1418: (+/−70, +/−70) mm

Midrange 1420, 1422, 1424 and 1426: (+/−120, +/−120) mm

Midrange 1428 and 1430: (+/−200, 0) mm

Midrange 1432 and 1434: (+/−340, 0) mm

Woofer 1436 and 1438: (+/−540, 0) mm

As with the loudspeakers illustrated in FIG. 11, the drivers may be mounted in a baffle 1476 comprised of separate sealed compartments 1440, 1442, 1444, 1446, 1448, 1450 and 1452. The tweeters 1402, 1404, 1406, 1408, 1410, 1412, 1414, 1416 and 1418 and midrange drivers 1420, 1422, 1424 and 1426 may all be contained in compartment 1440. On the right side, compartment 1440 may be separated from compartment 1444 by a separator represented by triangular line 1460. Compartment 1444 contains midrange driver 1430 and may be separated at its right from compartment 1448, which contains midrange driver 1434, by a separator represented by line 1464. To the right of compartment 1448, is compartment 1452, which contains woofer 1438. Compartments 1448 and 1452 may be separated from one another by a separator represented by line 1468.

Similarly, compartment 1440 may be separated from compartment 1442 on its left by a separator represented by the triangular line 1462. Compartment 1442 contains midrange driver 1428 and may be separated at its left from compartment 1446, which contains midrange driver 1432, by a separator represented by line 1466. To the left of compartment 1446, is compartment 1450, which contains woofer 1436. Compartments 1446 and 1450 may be separated from one another by a separator represented by line 1470.

As with the drivers of FIGS. 1 and 2, the tweeters 1402, 1404, 1406, 1408, 1410, 1412, 1414, 1416 and 1418 may be of an outer diameter of approximately 40-50 mm, the midrange drivers 1420, 1422, 1424, 1426, 1428, 1430, 1432 and 1434 may be of an outer diameter of approximately 80-110 mm, and the woofers 1436 and 1438 may be of an outer diameter of approximately 120-160 mm.

Figure 15:
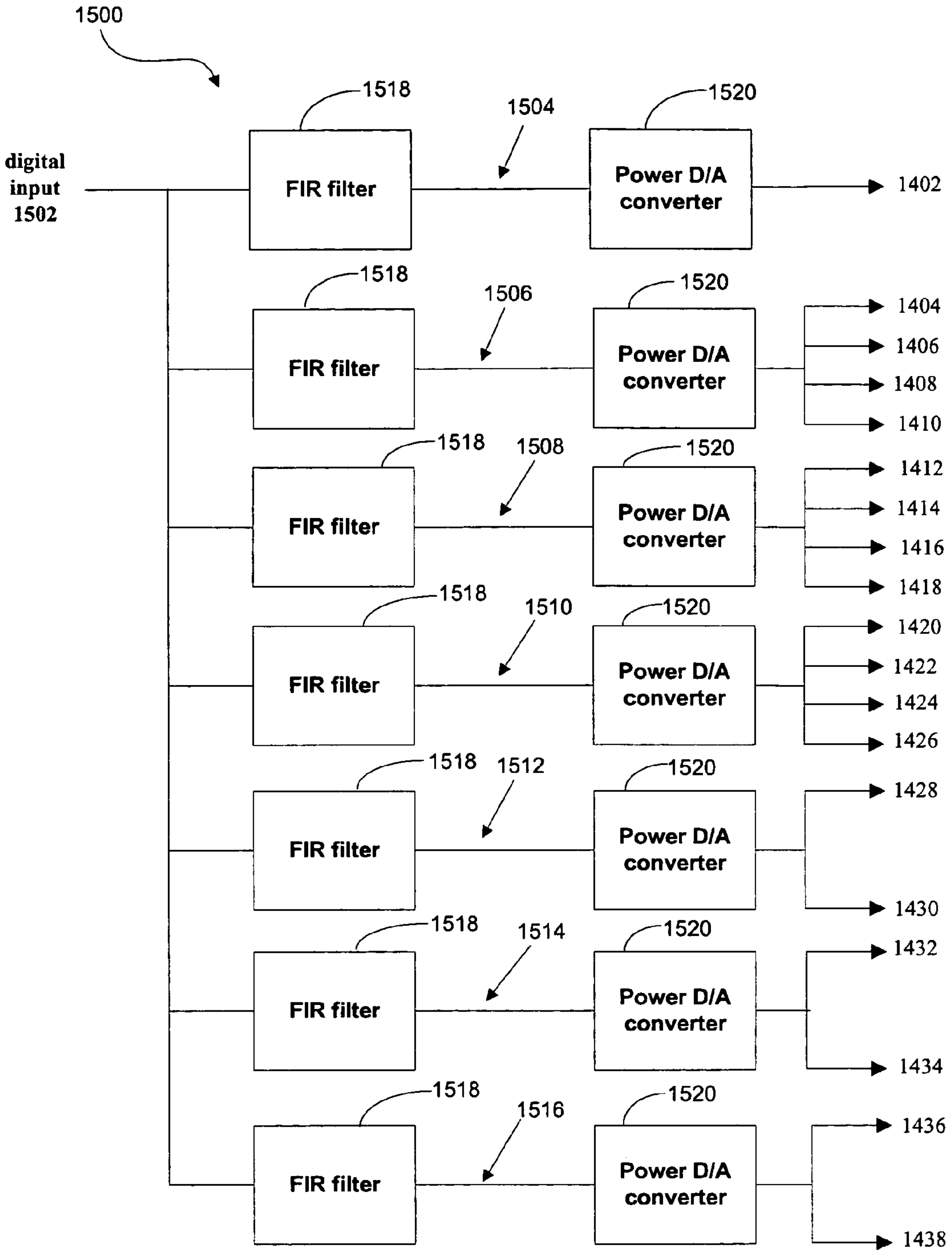
FIG. 15 is a block diagram of signal flow to each of the loudspeaker drivers in the loudspeaker system of FIG. 14.

FIG. 15 is a block diagram 1500 of signal flow to each of the loudspeaker drivers in the loudspeaker system 1400 of FIG. 14. As illustrated in FIG. 15, each one of the drivers having similar coordinate sets, as set forth above, is fed by different path or way, making this a seven-way loudspeaker. The loudspeaker system 1400 receives digital input 1502. The center tweeter 1402 being fed by signal flow way 1504. Tweeters 1404, 1406, 1408, and 1410 are fed by signal flow way 1506. Tweeters 1412, 1414, 1416 and 1418 are fed by signal flow way 1508. Mid-range drivers 1420, 1422, 1424 and 1426 are fed by signal flow way 1510, while mid-range drivers 1428 and 1430 are fed by signal flow way 1512 and mid-range drivers 1432 and 1434 are fed by signal flow way 1514. The pair of woofers 1436 and 1438 is fed by signal flow way 1516. Each signal flow way includes a FIR filter 1518 and power D/A converter 1520.

Figure 16:
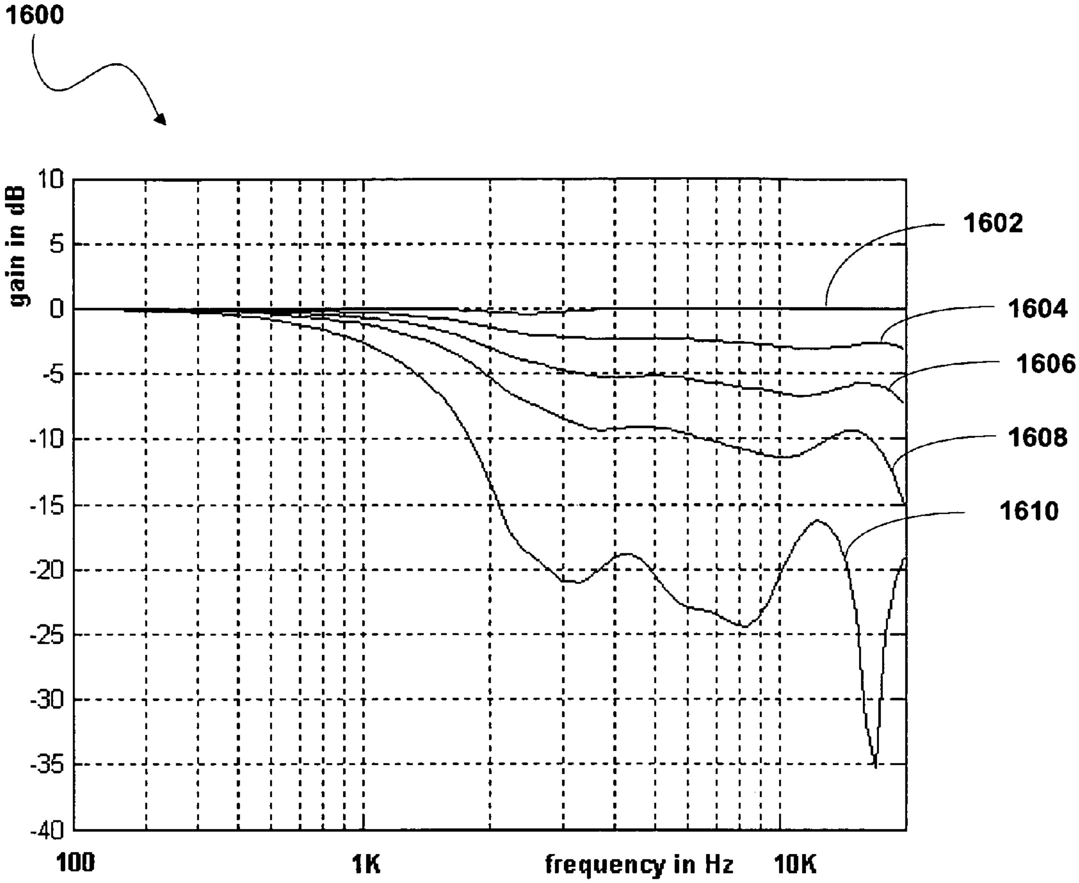
FIG. 16 illustrates the resulting vertical (y-axis) frequency responses of the loudspeaker system in FIG. 14 measured at various angles.

FIG. 16 is a graph 1600 illustrates the resulting vertical (y-axis) frequency responses of the loudspeaker system 1400 in FIG. 14 measured at various angles. The graph shows the obtained filter frequency responses V(f,q) after the requirements in step 314 in FIG. 3 have been met. In particular, line 1602 represents the resulting horizontal on-axis response V(f, q(1)), line 1604 is the frequency response at ten degrees V(f,q(2)), line 1406 is the response at fifteen degrees V(f,q (3)), line 1608 is the response at twenty degrees V(f,q(4)), line 1610 is the response at thirty degrees V(f,q(5)), all shown at frequencies ranging between 100 Hz and 20 kHz. As seen by FIG. 16, the vertical frequency responses for the two-dimensional loudspeaker system 1400 of FIG. 14 resembles the horizontal frequency responses, as illustrated by FIG. 13, for the one-dimensional loudspeaker system 1100 in FIG. 11, but having a considerably higher lower corner frequency above which the system becomes directive.

Figure 17:
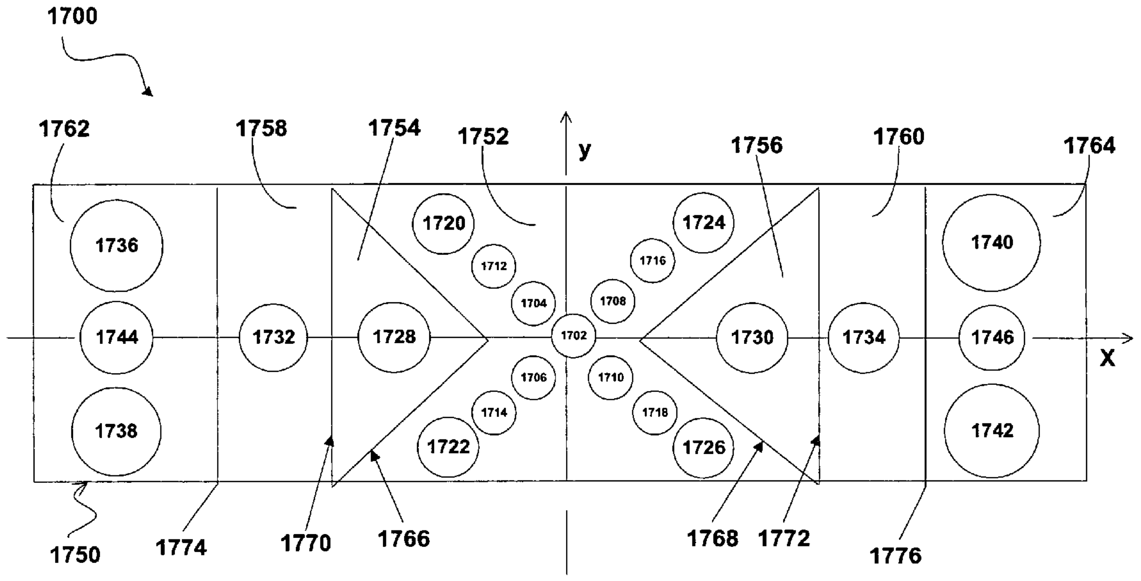
FIG. 17 illustrates an example implementation of a two-dimensional (2D), five-channel, multi-way loudspeaker system mounted symmetrically along the x-axis and y-axis designed for use for home theatre applications.

FIG. 17 illustrates an example implementation of a two-dimensional (2D), five-channel, multi-way loudspeaker system 1700 mounted symmetrically along the x-axis. The loudspeaker system 1700 is designed with a pair of integrated two-way stereo speakers mounted symmetrically along the x-axis and specifically designed for use for home theatre applications. As will be further explained below (FIGS. 18-20), the loudspeaker system 1700 may have five input channels L (left), R (right), C (center), LS (left surround), and RS (right surround).

The loudspeaker system 1700 is similar to that in FIG. 14 except that it provides two additional tweeters 1744 and 1746 and two additional woofers, such that the outer woofers are split into pairs 1736 and 1738 and 1740 and 1742 having the additional pair of tweeters 1744 and 1746 positioned between each pair of woofers 1736 and 1738 and 1740 and 1742, respectively, about the y-axis. By having tweeters 1744 and 1746 assigned to the pairs 1736 and 1738 and 1740 and 1742 of woofers, respectively, the loudspeaker system 1700 may provide array independent stereo speaker channels (i.e. the tweeter may be fed a signal supplied by a separate channel). The purpose of the independent stereo speaker channels is to provide an integrated surround sound system with conventional stereo speakers and directed sound beams generated by the array to reproduce ambient rear channels indirectly using wall reflections in the listening room.

Like the loudspeaker system 1400 illustrated in FIG. 14, the loudspeaker system 1700 of FIG. 17 has (i) a center tweeter 1702; (ii) two pairs of tweeters 1704 and 1706 and 1708 and 1710 arranged in a quadratic configuration about the center tweeter 1702; (iii) two additional pairs of tweeters 1712 and 1714, and 1716 and 1718 positioned on a further distant quadrant, symmetrically along the x and y axis and (iv) two pairs of mid-range drivers 1720 and 1722 and 1724 and 1726 positioned on an even further distant quadrant, symmetrically along the x and y axis. The quadrants are defined by forty-five (45) degree angles relative to the x-axis.

Additionally, the loudspeaker system 1700 includes midrange drivers 1728, 1730, 1732 and 1743 linearly spaced across the x-axis. The (x, y) coordinates of the drivers of the loudspeaker system 1700 may be as follows:

Tweeter 1702: (0, 0)
Tweeters 1704, 1706, 1708 and 1710: (+/−35, +/−35) mm
Tweeters 1712, 1714, 1716 and 1718: (+/−70, +/−70) mm
Midrange 1720, 1722, 1724 and 1726: (+/−120, +/−120) mm
Midrange 1728 and 1730: (+/−200, 0) mm
Midrange 1732 and 1734: (+/−340, 0) mm
Tweeters 1744 and 1746: (+/−540, 0) mm
Woofer 1736, 1738, 1740 and 1742: (+/−540, +/−90) mm As with the loudspeakers systems illustrated in FIGS. 1, 2, 6, 11 and 14, the drivers of the loudspeaker system 1700 may be mounted in a baffle or housing 1750 comprised of separate sealed compartments 1752, 1754, 1756, 1758, 1760, 1762 and 1764, which are divided from one other by separators represented by lines 1766, 1768, 1770, 1772, 1774 and 1176, respectively.

Figure 18:
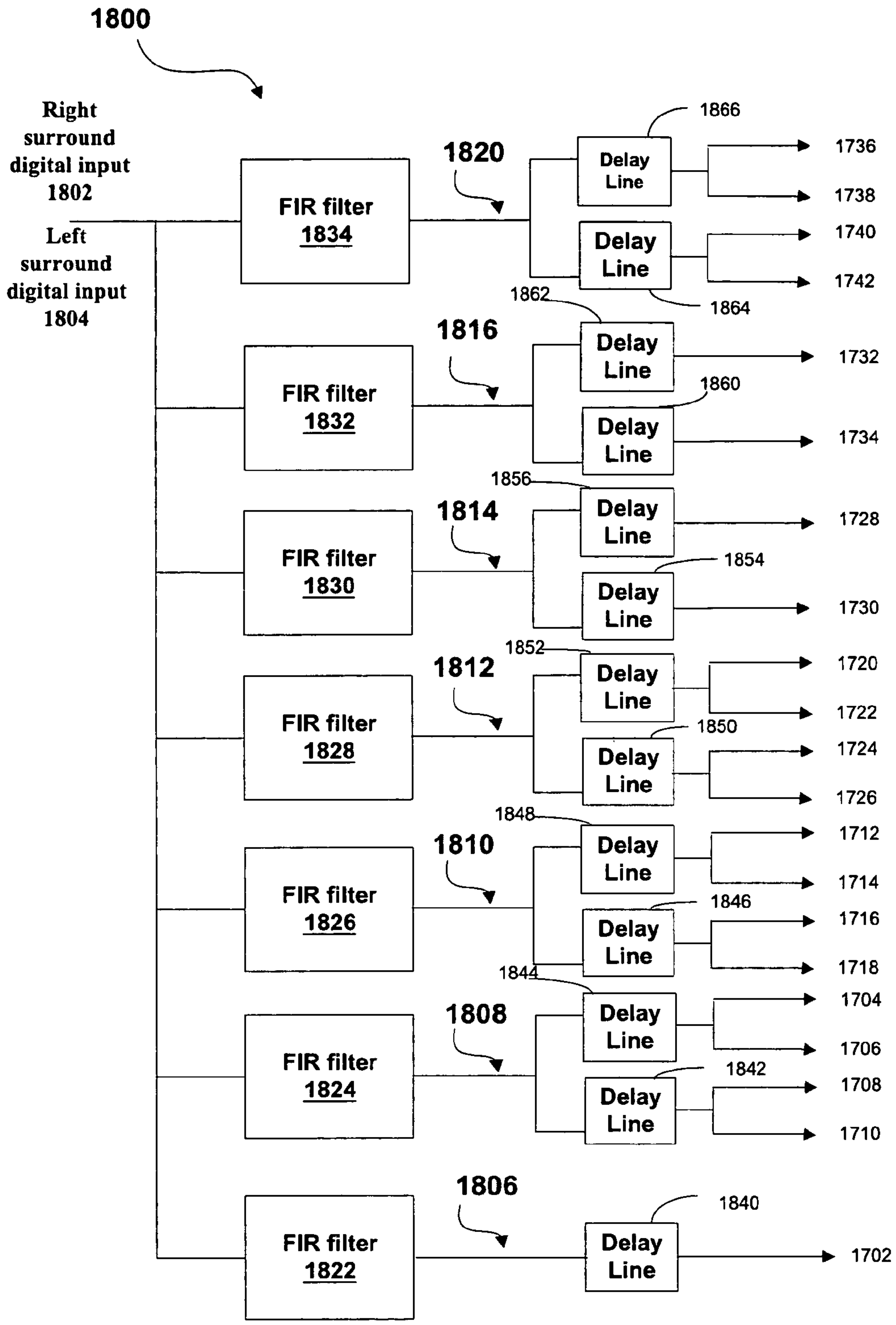
FIG. 18 is a block diagram of the signal flows for the right and left surround channels for the loudspeaker system in FIG. 17.
Figure 19:
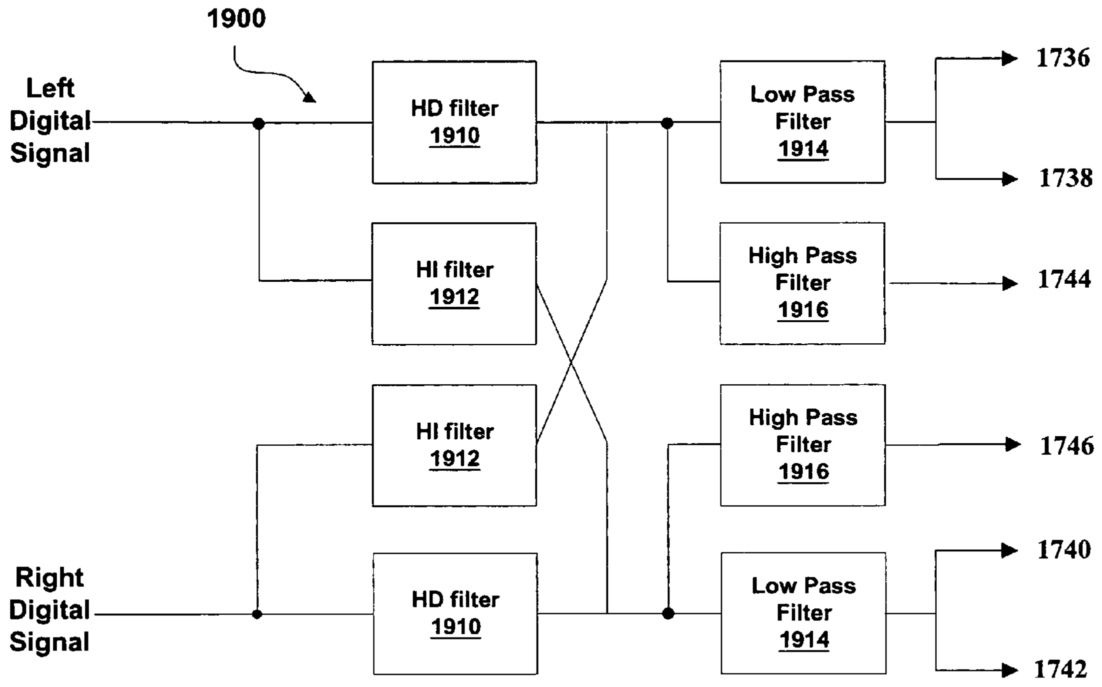
FIG. 19 is a block diagram of the signal flows for the right and left channels for the loudspeaker system in FIG. 17.
Figure 20:
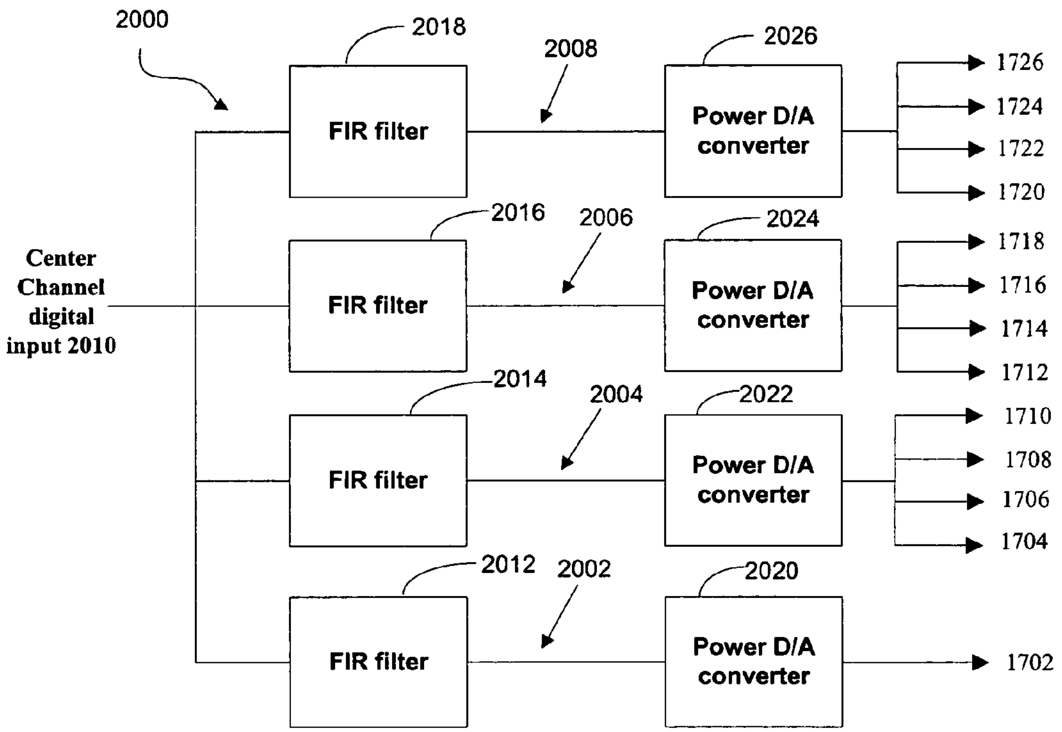
FIG. 20 is a block diagram of the signal flows for the center channel for the loudspeaker system in FIG. 17.

FIGS. 18-20 illustrate the block diagrams of the signal flows for the five-input signals of the loudspeaker system 1700 of FIG. 17. FIG. 18 is a block diagram 1800 of the signal flows for a surround channels for the loudspeaker system 1700 in FIG. 17. Since the signal flows for the right and left surround channels in the system 1700 are identical except for different delay values, as further described below, the diagram 1800 in FIG. 18 is representative of the signal flow paths for both the left and right surrounds. Thus, both the left and right surround input signals pass through a signal path system similar to that shown in FIG. 18. The sum of the respective output signals, as depicted in FIG. 18, is then computed and connected to the transducers. The outputs of the FIR filters, the frequency responses of which are shown in FIG. 12, are connected to delay lines $D_0$, and pairs of delay lines $D_{+/-(1 \ldots 6)}$, respectively.

The signal flow diagram 1800 in FIG. 18 illustrates how delays may be added to each path in accordance with the following equation:

$$\Delta t = p/c \cdot \sin\alpha, \ (p = \text{driver coordinates in } m,\ c = 345 \text{ m/sec speed of sound})$$

where the main sound beam, which is otherwise perpendicular to the main axis, can be steered to a desired direction with angle α. Typical values for α are −(40 . . . 60)degrees for the left surround, and +(40 . . . 60)degrees for the right surround, which means that sound beams are formed and steered towards side walls in the direction of angles α and −α bouncing against the walls and arriving at the listener as surround signals.

As illustrated in FIG. 18, signal flow path diagram 1800 illustrates the flow paths for the digital inputs for the right and left surround sound channels 1802 and 1804, respectively. The FIR filter 1822 output for path 1806 is connected to delay line ($D_0$) 1840 which is connected to the center tweeter 1702. The FIR filter 1824 output for path 1808 is connected in parallel to delay line ($D_{-1}$) 1842 and ($D_{+1}$)) 1844. Delay line 1842 is connected to the right pair of tweeters 1708 and 1710 and delay line 1844 is connected to the left pair of tweeters 1704 and 1706. Similarly, the FIR filter 1826 output for path 1810 is connected in parallel to delay line ($D_{-2}$) 1846 and ($D_{+2}$) 1848. Delay line 1846 is connected to the right pair of tweeters 1716 and 1718 and delay line 1848 is connected to the left pair of tweeters 1712 and 1714. Delay lines ($D_{-3}$) 1850 and ($D_{+3}$) 1852 are connected to the midrange drivers 1720 and 1722 and 1724 and 1726, respectively, which are connected in parallel to path 1812, which is the output path for FIR filter 1828.

Midrange drivers 1728 and 1730 are connected to delay lines ($D_{+4}$) 1856 and ($D_{-4}$) 1854, respective, which are the output path 1814 for FIR filter 1830. Midrange drivers 1732 and 1734 are connected to delay lines ($D_{+5}$) 1862 and ($D_{-5}$) 1860, respective, which are the output path 1816 for FIR filter 1832.

The right pair of woofers 1740 and 1742 is connected to delay line ($D_{-6}$) 1864 and the left pair of woofers 1736 and 1738 is connected to the delay line ($D_{+6}$) 1866. Delay lines ($D_{+6}$) 1866 and ($D_{-6}$) 1864 are connected in parallel to the output path 1820 for the FIR filter 1834.

FIG. 19 is a block diagram of the signal flows for the right and left channels for the loudspeaker system in FIG. 17. The left and right channels are integrated as conventional two-way speakers. The left channel is comprised of tweeter 1744, which is not part of the beam forming array, and woofers 1736 and 1738. The right channel is comprised of the tweeter 1746 and woofers 1740 and 1742.

As illustrated by FIG. 19, the signal processing 1900 for the left and right channels uses a stereo widening circuit comprised of HD filters 1910 and HI filters 1912 to widen the stereo basis and a crossover circuit with low pass filters 1914 and HP high pass filters 1916.

FIG. 20 is a block diagram of the signal flows for the center channel for the loudspeaker system 1700 in FIG. 17. The center channel is reproduced by the inner array of tweeters 1702, 1704, 1706, 1708, 1710, 1712, 1714, 1716 and 1718 and mid-range drivers 1720, 1722, 1724 and 1726 with FIR filters having coefficients determined as set forth in FIG. 3.

The output of the digital signal for the center channel 2010 is divided into four signal paths 2002, 2004, 2006 and 2008, each having a FIR filter 2012, 2014, 2016 and 2018, respectively, and a Power D/A converter 2020, 2022, 2024 and 2026, respectively. Path 2002 feeds the center tweeter 1702. Path 2004 feeds the innermost quadrant of tweeters 1704, 1706, 1708 and 1710. Path 2006 feeds the outermost quadrant of tweeters 1712, 1714, 1716 and 1718 and path 2008 feeds the center quadrant of mid-range drivers 1720, 1722, 1724 and 1726.

Figure 21:
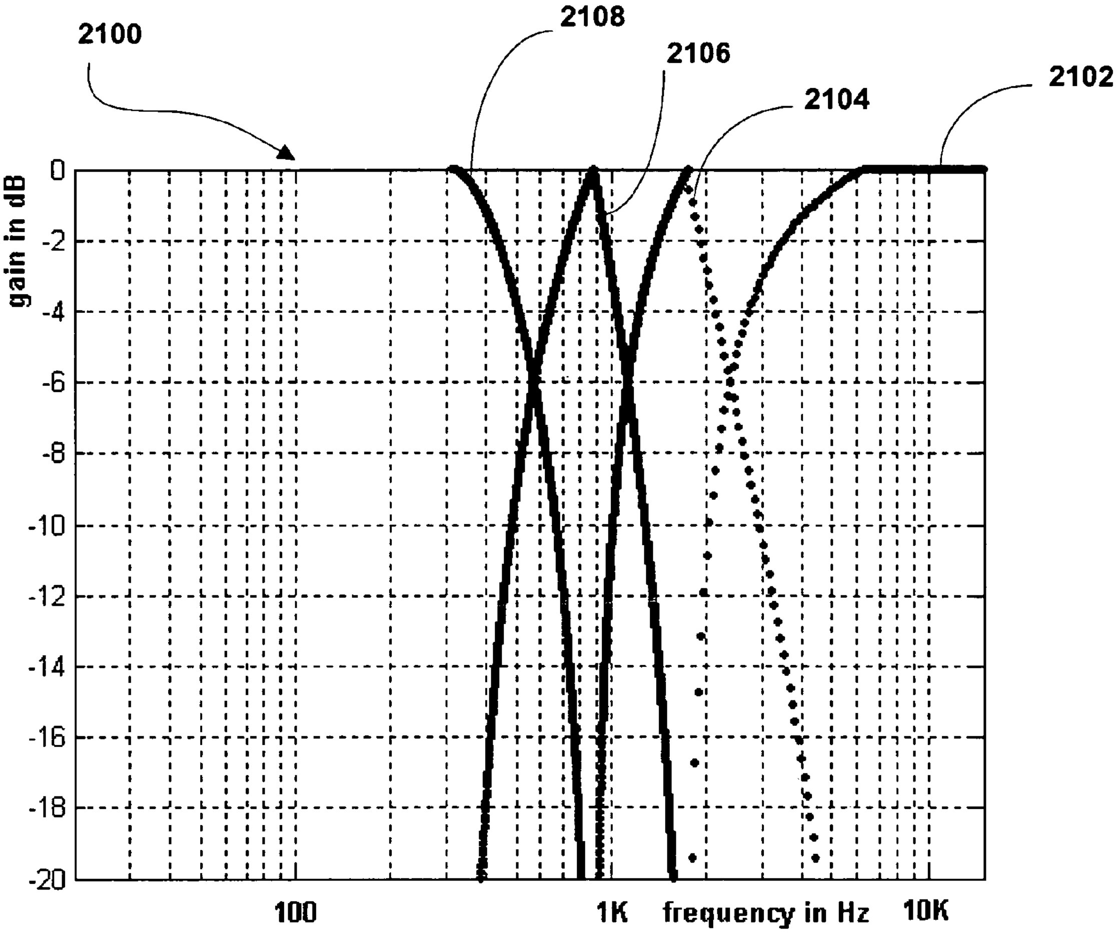
FIG. 21 the frequency responses of the four filters of the center channel of the loudspeaker system in FIG. 17.

FIG. 21 is a graph 2100 illustrating the frequency responses of the four FIR filters used in the center channel (FIG. 20) of the loudspeaker system of FIG. 17. Line 2102 represents the frequency response of FIR filter 2012, line 2104 represents the frequency response of FIR filter 2014, line 2106 represents the frequency response of FIR filter 2016 and line 2108 represents the frequency response of FIR filter 2018.

Figure 22:
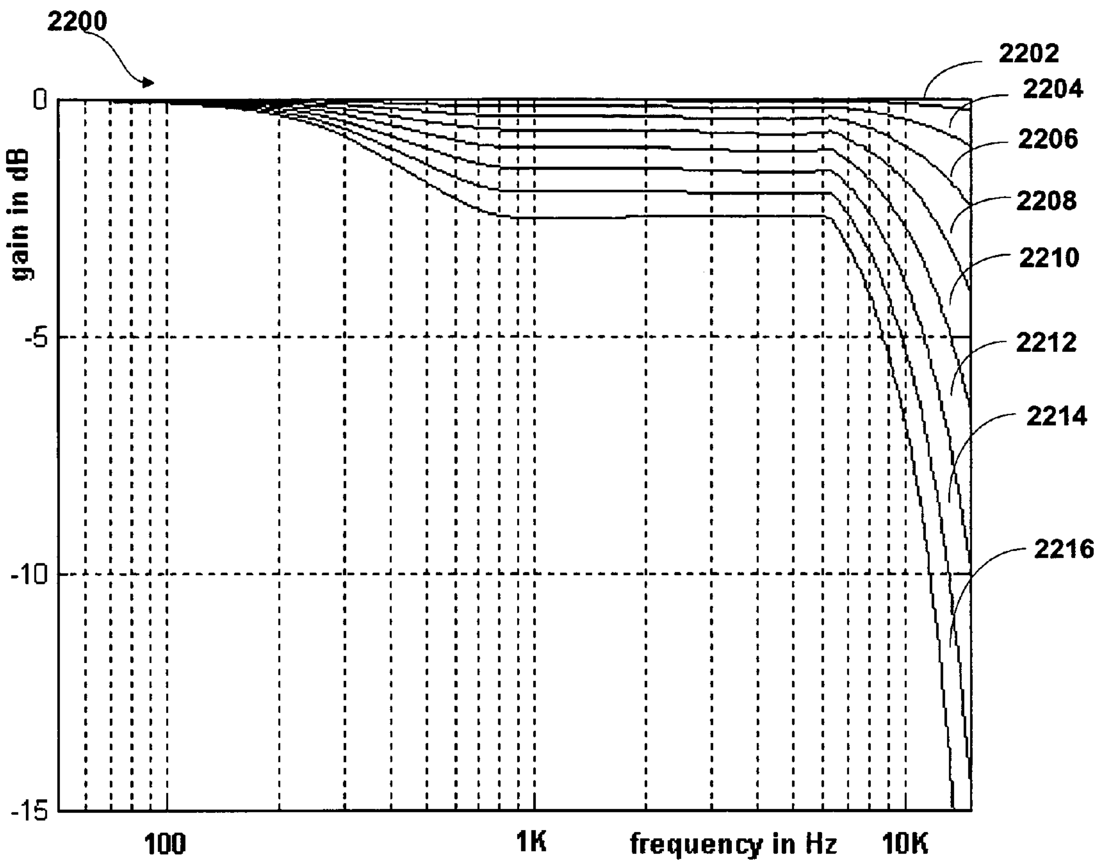
FIG. 22 illustrates the resulting horizontal (x-axis) frequency responses of the center channel of the loudspeaker system in FIG. 17 measured at various angles.

FIG. 22 is a graph 2200 illustrating the resulting horizontal (x-axis) and identical vertical (y-axis) frequency responses of the center channel output (FIG. 20) of the loudspeaker system 1700 of FIG. 17 measured at various angles. The graph shows the obtained filter frequency responses V(f,q) after meeting the requirement of step 314 in FIG. 3. In particular, line 2202 represents the resulting horizontal on-axis response V(f,q(1)), line 2204 is the frequency response at five degrees V(f,q(2)), line 2206 is the response at ten degrees V(f,q(3)), line 2208 is the response at fifteen degrees V(f,q(4)), line 2210 is the response at twenty degrees V(f,q(5)), line 2212 is the response at twenty-five degrees V(f,q(6)), line 2214 is the response at thirty degrees V(f,q(7)), and line 2216 is the response at thirty-five degrees V(f,q(8)), all shown at frequencies ranging between 100 Hz and 20 kHz.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A loudspeaker array comprising:

at least one digital FIR filter configured to receive a digital audio signal from an audio sound source;

at least one power D/A converter configured to receive a filtered signal from the at least one FIR filter, where the at least one digital FIR filter includes linear phase filter coefficients determined for optimized transducer positions; and a plurality of transducers of at least two different sizes, the plurality of transducers arranged symmetrically about a first axis and about a second axis perpendicular to the first axis at optimized transducer positions determined and optimized using a cost minimization function to determine a minimum difference between a desired performance of the loudspeaker array indicated by a directivity target function and a measured frequency response, the plurality of transducers coupled to the at least one power D/A converter.

2. The loudspeaker array of claim 1 where the at least two different sizes of the plurality of transducers are tweeters and midrange drivers.

3. The loudspeaker array of claim 1 where the at least two different sizes of the plurality of transducers are tweeters and woofers.

4. The loudspeaker array of claim 1 where the plurality of drivers include tweeters, midrange drivers and woofers.

5. The loudspeaker array of claim 1 further comprising a center transducer positioned with its center at the intersection of the first and second axis.

6. The loudspeaker array of claim 5 where the center transducer receives a signal from at least one power D/A converter that has been filtered through at least one digital FIR filter.

7. The loudspeaker array of claim 1 where the linear phase filter coefficients for each FIR filter is determined by establishing the initial driver positions; establishing the initial directivity target functions for the system; applying the cost minimization function based upon the initial directivity target function; and computing linear phase filter coefficients for each filter in the system.

8. The loudspeaker array of claim 7 where the initial driver positions are coordinates relative to the center of origin of the loudspeaker.

9. The loudspeaker array of claim 7, where frequency points are established on a logarithmic scale with a predetermined frequency range based upon the established initial directivity target functions.

10. The loudspeaker array of claim 7, where the cost minimization function is applied at the frequency points, starting with the lowest frequency increment stepwise.

11. The loudspeaker array of claim 7, where the Fourier approximation method is utilized to establish the linear phase filter coefficients.

12. A loudspeaker system comprising:

at least one digital FIR filter configured to receive a digital audio signal from an audio sound source;

at least one power D/A converter configured to receive a filtered signal from the at least one FIR filter, where the at least one digital FIR filter includes linear phase filter coefficients determined for optimized transducer positions; and at least five transducers of at least two different sizes, four of the at least five transducers symmetrically arranged about both a first axis and a second axis perpendicular to the first axis, and one transducer centered at the intersection of the first and second axes, the symmetrically arranged transducers positioned at optimized transducer positions determined and optimized using a cost minimization function to determine a minimum difference between a desired performance of the loudspeaker array indicated by a directivity target function and a measured frequency response, the plurality of transducers configured to receive an audio signal output from. the at least one power D/A converter.

* * * * *

UNITED STATES PATENT AND TRADEMARK OFFICE

CERTIFICATE OF CORRECTION

PATENT NO. : 8,160,268 B2
APPLICATION NO. : 10/935929
DATED : April 17, 2012
INVENTOR(S) : Horbach It is certified that error appears in the above-identified patent and that said Letters Patent is hereby corrected as shown below:

In FIG. 6, the housing of the loudspeaker system 600 should be labeled with reference numeral 631.

In FIG. 11, the FIR filter currently labeled with reference numeral 1178 should be labeled with reference numeral 1179.

At column 6, line 56, "...midrangedrivers216,..." should be changed to -- midrange drivers 212, --.

At column 8, line 6, "...0 db..." should be changed to -- ...0 dB... --.

At column 8, line 14, "...the next step 312 is..." should be changed to -- the next step 312 (FIG. 3) is --.

At column 9, line 62, "...+/ 300..." should be changed to -- +/- 300 --.

At column 9, line 66, "...housing 630..." should be changed to -- housing 630 --.

At column 10, line 26, "...line 718..." should be changed to -- line 808 --.

At column 10, line 29, "The graph..." should be changed to -- The graph 900 --.

At column 11, line 35, "...FIR filter 1178..." should be changed to -- FIR filter 1179 --.

At column 11, lines 55–56, "...FIR filter 1178..." should be changed to -- FIR filter 1179 --.

At column 12, line 23, "...mid-range drivers 1420, 1422, 1424, and 1428..." should be changed to -- midrange drivers 1420, 1422, 1424, and 1426 --.

At column 13, line 27, "...line 1406..." should be changed to -- line 1606 --.

Signed and Sealed this
Twenty-ninth Day of January, 2013

David J. Kappos

David J. Kappos
*Director of the United States Patent and Trademark Office*

At column 14, line 8, "...midrangedrivers 1728, 1730, 1732, and 1743..." should be changed to -- midrange drivers 1728, 1730, 1732, and 1734 --.

At column 14, line 25, "...and 1176..." should be changed to -- and 1776 --.

At column 15, line 5, "...1720 and 1722 and 1724 and 1726 respectively..." should be changed to -- 1724, 1726, 1720, and 1722 respectively --.

At column 15, line 9, "..., respective,..." should be changed to -- , respectively, --.

At column 15, line 31, "...is a block diagram of..." should be changed to -- is a block diagram 2000 of --.